United States Patent
Umeda

(10) Patent No.: US 10,103,033 B2
(45) Date of Patent: Oct. 16, 2018

(54) MANUFACTURING METHOD OF SEMICONDUCTOR DEVICE

(71) Applicant: RENESAS ELECTRONICS CORPORATION, Tokyo (JP)

(72) Inventor: Daisuke Umeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/706,256

(22) Filed: Sep. 15, 2017

(65) Prior Publication Data

US 2018/0090337 A1 Mar. 29, 2018

(30) Foreign Application Priority Data

Sep. 27, 2016 (JP) ................. 2016-188465

(51) Int. Cl.
*H01L 21/3105* (2006.01)
*H01L 21/311* (2006.01)
(Continued)

(52) U.S. Cl.
CPC ........ *H01L 21/31051* (2013.01); *G03F 7/038* (2013.01); *G03F 7/039* (2013.01); *G03F 7/091* (2013.01); *G03F 7/162* (2013.01); *G03F 7/20* (2013.01); *G03F 7/26* (2013.01); *H01L 21/02118* (2013.01); *H01L 21/02282* (2013.01);
(Continued)

(58) Field of Classification Search
CPC ......... H01L 21/31051; H01L 21/31127; H01L 21/02282; H01L 21/02118; H01L 21/31058; H01L 21/0276; H01L 27/11524; H01L 27/11531; H01L 27/11529; G03F 7/162; G03F 7/039; G03F 7/091; G03F 7/26; G03F 7/20; G03F 7/038
See application file for complete search history.

(56) References Cited

U.S. PATENT DOCUMENTS 6,023,099 A * 2/2000 Komuro ................ H01L 27/105
257/296
6,599,665 B1 * 7/2003 Lin .......................... G03F 1/36
430/323
(Continued)

FOREIGN PATENT DOCUMENTS

JP 2010-245160 A 10/2010

*Primary Examiner* — Anita K Alanko
(74) *Attorney, Agent, or Firm* — McDermott, Will & Emery LLP

(57) ABSTRACT

An object of the present invention is to provide a semiconductor device including a film to be processed having a uniform height. A first coating film made of photosensitive material is formed so as to cover step parts and to become thicker in a central part of a semiconductor substrate in planar view and to become thinner in an outer peripheral part. Next, a first pattern part located on the central part side relative to the step parts and a second pattern part located on the outer peripheral part side relative to the step parts are formed. The first pattern part and the second pattern part are formed so that the occupied area of the first pattern part in planar view becomes smaller than that of the second pattern part in planar view. Next, the first pattern part and the second pattern part are sagged by heating. Next, a second coating film is formed by spin coating so as to cover the step parts.

12 Claims, 25 Drawing Sheets

(51) Int. Cl.
  *G03F 7/16*      (2006.01)
  *G03F 7/039*     (2006.01)
  *H01L 21/02*     (2006.01)
  *G03F 7/09*      (2006.01)
  *G03F 7/26*      (2006.01)
  *G03F 7/20*      (2006.01)
  *G03F 7/038*     (2006.01)
  *H01L 21/027*    (2006.01)
  *H01L 27/115*    (2017.01)
  *H01L 27/11531*  (2017.01)
  *H01L 27/11524*  (2017.01)
  *H01L 27/11529*  (2017.01)

(52) U.S. Cl.
  CPC .. *H01L 21/31058* (2013.01); *H01L 21/31127* (2013.01); *H01L 21/0276* (2013.01); *H01L 27/11524* (2013.01); *H01L 27/11529* (2013.01); *H01L 27/11531* (2013.01)

(56) References Cited

U.S. PATENT DOCUMENTS

| | | |
|---|---|---|
| 8,076,191 B2 | 12/2011 | Yamakoshi et al. |
| 2004/0065917 A1 | 4/2004 | Fan et al. |
| 2008/0237652 A1* | 10/2008 | Azumi .............. H01L 27/14812 257/231 |

\* cited by examiner

MANUFACTURING METHOD OF SEMICONDUCTOR DEVICE

CROSS-REFERENCE TO RELATED APPLICATIONS

The disclosure of Japanese Patent Application No. 2016-188465 filed on Sep. 27, 2016 including the specification, drawings and abstract is incorporated herein by reference in its entirety.

BACKGROUND

The present invention relates to a manufacturing method of a semiconductor device.

For example, a semiconductor device including a plurality of kinds of circuit patterns such as memory cells has been known. In such a semiconductor device, a plurality of step parts (various kinds of electrodes and the like) provided in a convex manner on the main surface of a semiconductor substrate is formed. A manufacturing method of such a semiconductor device includes a step of forming various kinds of films on and between the step parts formed on the semiconductor substrate and a step (a photolithography step, an etch back processing step, or the like) of processing the films. The films are formed in such a manner that a material with a high degree of fluidity is spin-coated on the main surface of the semiconductor substrate.

The step of processing the coated film formed by spin coating is disclosed in, for example, Japanese Unexamined Patent Application Publication No. 2010-245160 and US Patent Application Publication No. 2004/0065917.

Japanese Unexamined Patent Application Publication No. 2010-245160 discloses a manufacturing method of a semiconductor device to solve a problem in which an antireflective film with a high degree of fluidity flows from a high step region to a low step region and disappears. In the manufacturing method of the semiconductor device described in Japanese Unexamined Patent Application Publication No. 2010-245160, a dummy electrode and a polysilicon film are formed as step parts while sandwiching a gap groove. Accordingly, in the case where the antireflective film with a high degree of fluidity is applied so as to cover the step parts, the disappearance of the antireflective film in the high step region is suppressed.

US Patent Application Publication No. 2004/0065917 discloses a memory cell having a transistor structure different from Japanese Unexamined Patent Application Publication No. 2010-245160 and a manufacturing method thereof.

SUMMARY

However, the film thickness of the coated film formed on the central part side of the semiconductor substrate relative to the step parts in planar view becomes thicker than that of the coated film formed on the outer peripheral part side of the semiconductor substrate relative to the step parts in planar view. Namely, the height of the upper surface of the coated film is not uniform with respect to the main surface of the semiconductor substrate. Therefore, in the case where a film to be processed covered by the coated film is processed by an etch back process or the like, it is difficult to obtain a semiconductor device including a film to be processed having a uniform height in a manufacturing method of a semiconductor device in the past.

The other objects and novel features will become apparent from the description of the specification and the accompanying drawings.

In a manufacturing method of a semiconductor device according to an embodiment, a semiconductor substrate having a main surface and having a first step region where a first step part is formed on the main surface is prepared. A first coating film made of photosensitive material having fluidity is formed by spin coating so as to cover a plurality of step parts and to become thicker in a central part of the semiconductor substrate in planar view and to become thinner in an outer peripheral part. At least one first pattern part located on the central part side relative to the step parts and at least one second pattern part located on the outer peripheral part side relative to the step parts are formed in the radial direction of the semiconductor substrate by exposing and developing a portion of the first coating film so that the occupied area of the at least one first pattern part in planar view becomes smaller than that of the at least one second pattern part in planar view. The first pattern part and the second pattern part are sagged by heating. After sagging the first pattern part and the second pattern part, a second coating film made of material having fluidity is formed by spin coating so as to cover the step parts. At least a portion of the second coating film is removed.

According to the embodiment, it is possible to obtain a semiconductor device including a film to be processed having a uniform height.

DETAILED DESCRIPTION

Figure 1:
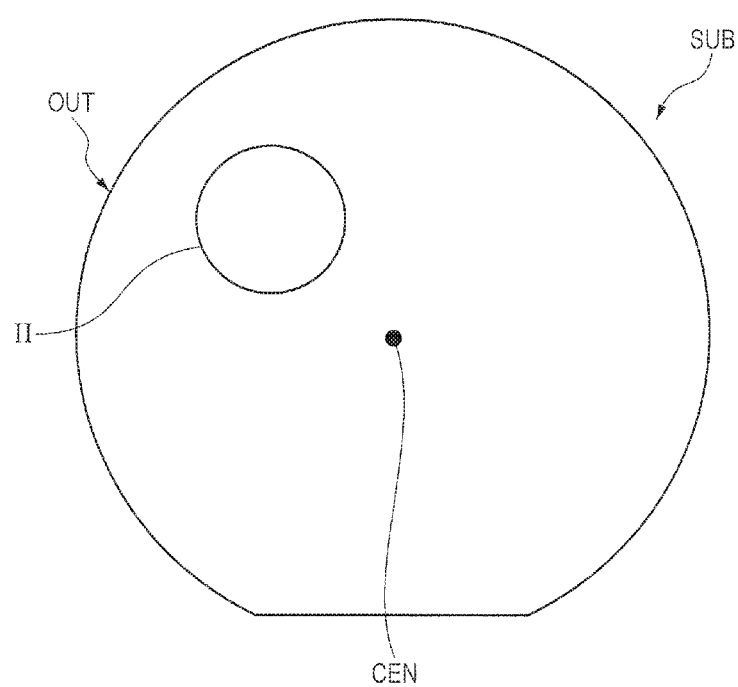
FIG. 1 is a top view for showing a semiconductor substrate in a first step of a manufacturing method of a semiconductor device according to a first embodiment.

Hereinafter, embodiments will be described with reference to the drawings. It should be noted that the same or corresponding parts in the following drawings are followed by the same reference numerals, and the explanation thereof will not be repeated.

(First Embodiment)

Figure 2:
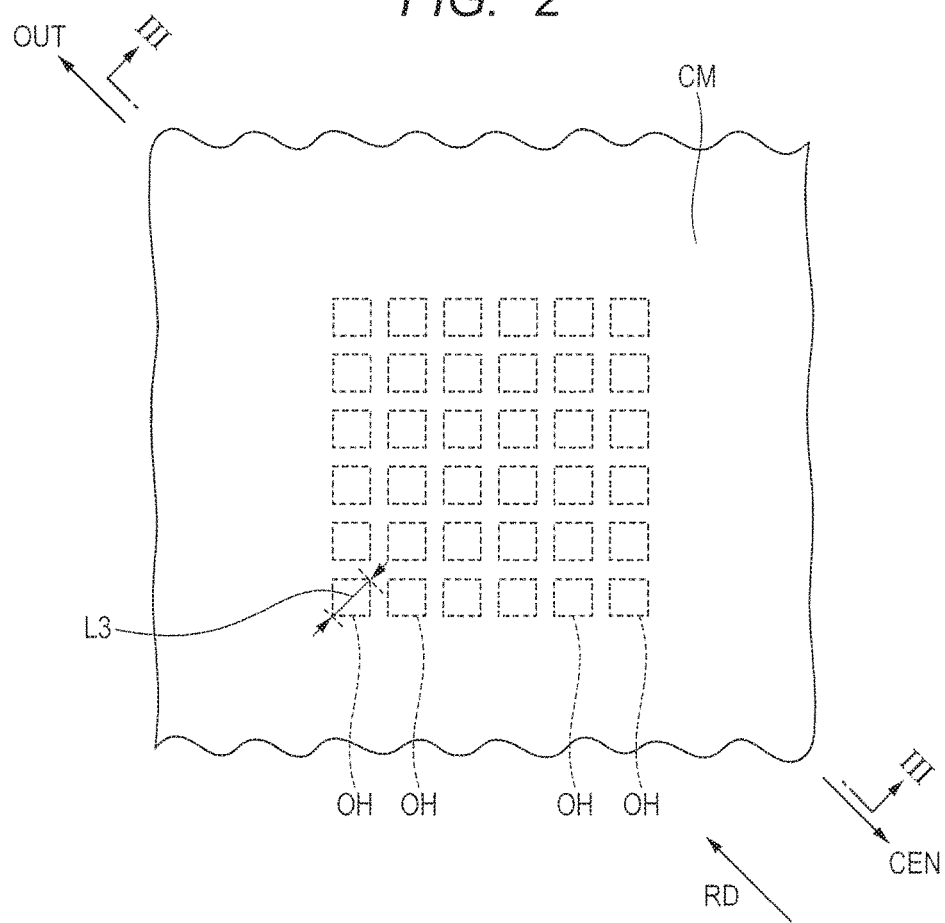
FIG. 2 is a partially-enlarged view of the region II in FIG. 1.
Figure 3:
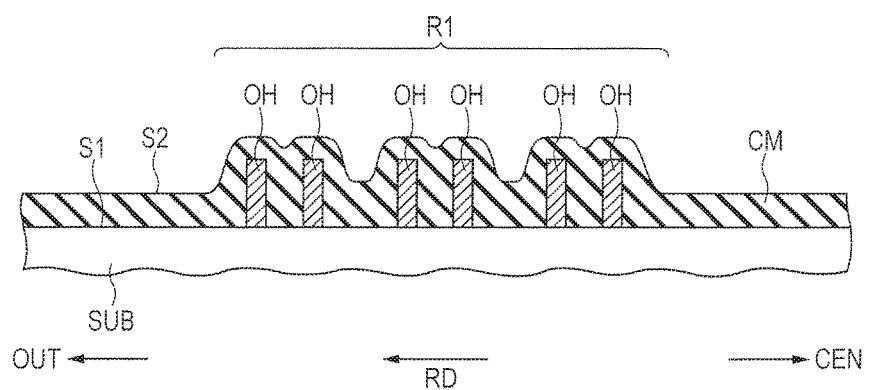
FIG. 3 is a cross-sectional view viewed from the arrow III-III in FIG. 2.

With reference to FIG. 1 to FIG. 10, a manufacturing method of a semiconductor device according to a first embodiment will be described. First, as shown in FIGS. 1 to 3, a semiconductor substrate SUB having a main surface S1 is prepared. As shown in FIG. 2 and FIG. 3, the semiconductor substrate SUB has a region R1 (first step region) in which a plurality of step parts OH (first step part) is formed on the main surface S1. As shown in FIG. 2 and FIG. 3, for example, the respective step parts OH are formed at intervals in the radial direction RD of the semiconductor substrate SUB. As shown in FIG. 3, each of the step parts OH is formed in a convex shape with respect to the main surface S1. Each of the step parts OH may have an arbitrary structure, and has, for example, the same structure. The respective step parts OH may have different structures. It should be noted that in FIGS. 2 to 6 and FIGS. 8 to 10, the right side of each drawing corresponds to the central part CEN side of the semiconductor substrate SUB, and the left side thereof corresponds to the outer peripheral part OUT side of the semiconductor substrate SUB.

As shown in FIG. 2 and FIG. 3, a covered film CM (a film to be processed) is formed so as to cover the step parts OH on the main surface S1 of the semiconductor substrate SUB. As shown in FIG. 3, an upper surface S2 of the covered film CM has a part where irregularities in accordance with the step parts OH are formed and a flat part formed on the main surface S1 where the step parts OH are not formed. The covered film CM may be formed by an arbitrary method, and is formed by, for example, a CVD (Chemical Vapor Deposition) method.

Figure 4:
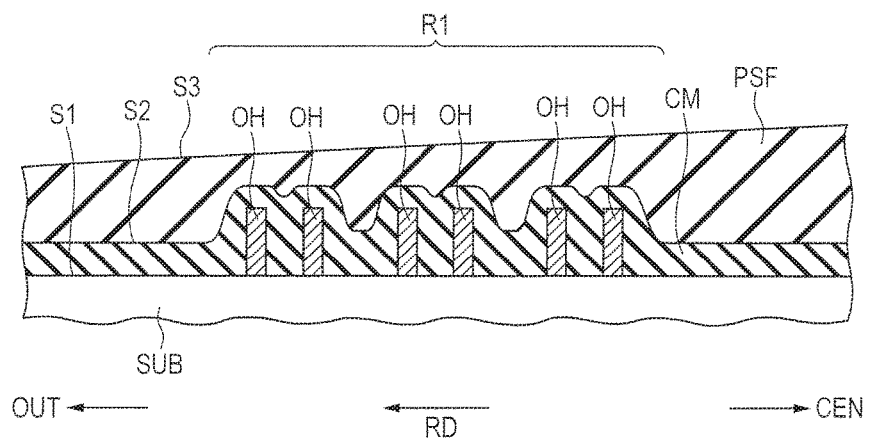
FIG. 4 is a cross-sectional view for showing a second step of the manufacturing method of the semiconductor device according to the first embodiment.

Next, as shown in FIG. 4, a first coating film PSF is formed on the upper surface S2 of the covered film CM. The material configuring the first coating film PSF is a photosensitive material that has fluidity and can be solidified. The material configuring the first coating film PSF is, for example, a resist. Here, the material (fluidity material) having fluidity is a material that can wet and spread by being subjected to centrifugal force generated when the semiconductor substrate SUB is rotated at a high speed, namely, a material that can be coated (spin-coated) by a spin coating method. The viscosity of the material configuring the first coating film PSF is, for example, 0.1 cP or more and 100 cP or less. The first coating film PSF is formed in such a manner that a photosensitive material having fluidity is spin-coated and then solidified.

The first coating film PSF is formed so as to cover the entire upper surface S2 of the covered film CM. The film thickness of the first coating film PSF is thicker than the maximum step difference H3 of the covered film CM. Here, the film thickness of the first coating film PSF means the distance between an upper surface S3 of the first coating film PSF formed on the covered film CM having the flat upper surface S2 and the upper surface S2 in the direction perpendicular to the main surface S1. The maximum step difference H3 of the covered film CM means the distance between the flat portion and a portion located on the step parts OH on the upper surface S2 of the covered film CM in the perpendicular direction.

The film thickness of the first coating film PSF varies according to the position in the radial direction RD. The film thickness of a portion of the first coating film PSF formed on a region located on the central part CEN side (inner side) relative to the region R1 is thicker than the film thickness of the other portion of the first coating film PSF formed on a region located on the outer peripheral part OUT side (outer side) relative to the region R1. The portion of the first coating film PSF formed on the region located on the central part CEN side relative to the region R1 includes a portion where a first pattern part PSF1 to be described later is formed. The other portion of the first coating film PSF formed on the region located on the outer peripheral part OUT side relative to the region R1 includes a portion where a second pattern part PSF2 to be described later is formed.

The film thickness of the first coating film PSF can be set on the basis of the swing curve shown in FIG. 7 in such a manner that the first coating film PSF covers the entire covered film CM and the finished dimension value of the first pattern part PSF1 to be described later is smaller than that of the second pattern part PSF2 (details will be described later).

Figure 5:
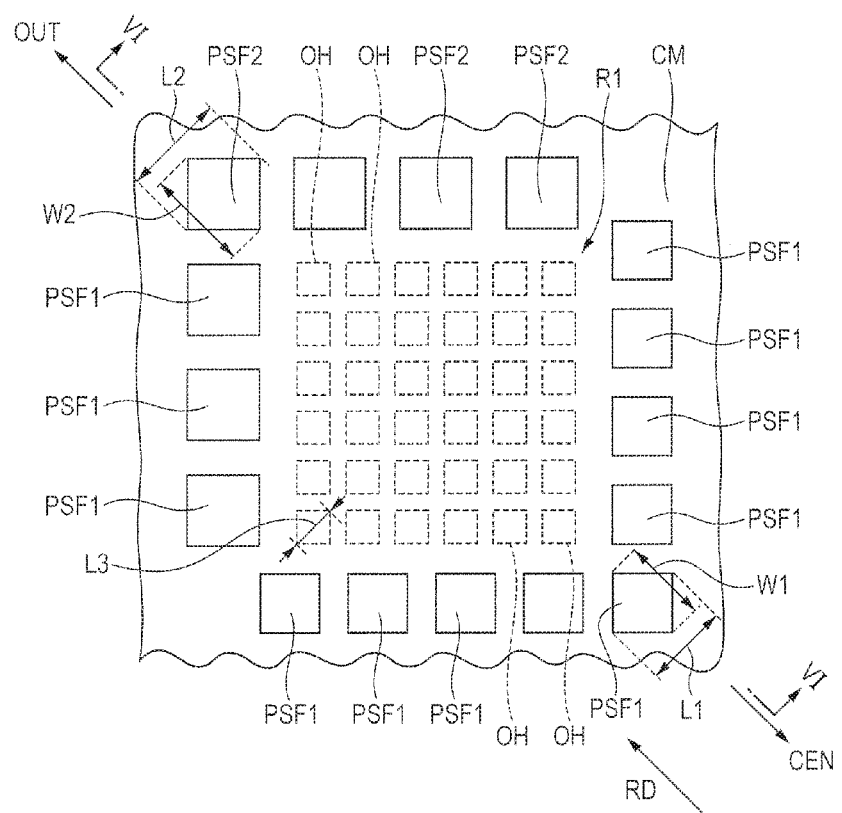
FIG. 5 is a top view for showing a third step of the manufacturing method of the semiconductor device according to the first embodiment.
Figure 6:
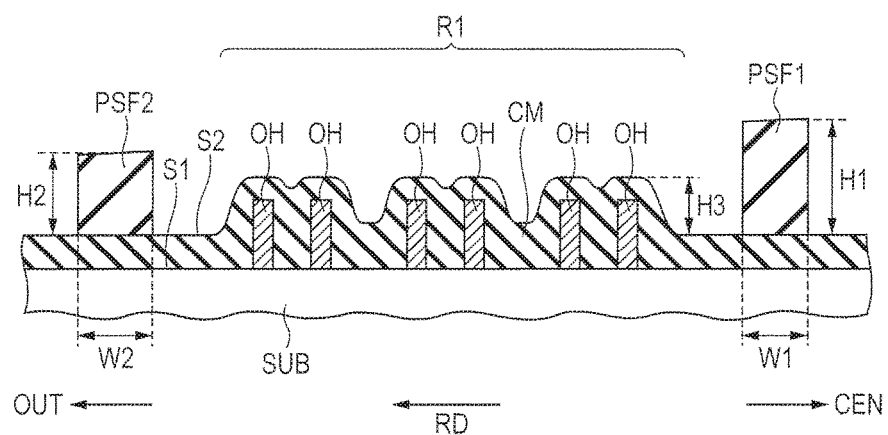
FIG. 6 is a cross-sectional view viewed from the arrow VI-VI in FIG. 5.

Next, as shown in FIG. 5 and FIG. 6, a portion of the first coating film PSF is exposed and developed, and a plurality of first pattern parts PSF1 and a plurality of second pattern parts PSF2 are formed. The respective first pattern parts PSF1 and second pattern parts PSF2 are dispersedly formed on, for example, the above-described flat part of the upper surface S2 of the covered film CM.

The first pattern parts PSF1 are formed on regions located on the central part CEN side relative to the region R1 in the radial direction RD. The second pattern parts PSF2 are formed on regions located on the outer peripheral part OUT side relative to the region R1 in the radial direction RD. One of the first pattern parts PSF1 and one of the second pattern parts PSF2 are preferably formed so as to sandwich at least one of the step parts OH in the radial direction RD. More preferably, as shown in FIG. 5, the first pattern parts PSF1 and the second pattern parts PSF2 are formed so as to surround the step parts OH. As shown in FIG. 6, the cross-sectional shape of each of the first pattern parts PSF1 and the second pattern parts PSF2 is, for example, a rectangular shape.

The one first pattern part PSF1 and the one second pattern part PSF2 formed so as to sandwich at least one of the step parts OH in the radial direction RD have the following relationship.

The occupied area of the one first pattern part PSF1 in planar view is smaller than that of the one second pattern part PSF2 in planar view. The planar view means to view the main surface S1 from the top in the direction orthogonal to the main surface S1. Here, the occupied area means the area occupied by the first pattern part PSF1 or the second pattern part PSF2 in planar view, namely, the area of the first pattern part PSF1 or the second pattern part PSF2 projected on the main surface S1.

The length L1 of the one first pattern part PSF1 in the direction intersecting the radial direction RD is shorter than the length L2 of the one second pattern part PSF2 in the direction intersecting the radial direction RD. The length W1 of the one first pattern part PSF1 in the radial direction RD is narrower than the length W2 of the one second pattern part PSF2 in the radial direction RD. The thickness H1 of the one first pattern part PSF1 is thicker than the thickness H2 of the one second pattern part PSF2.

Namely, the one first pattern part PSF1 and the one second pattern part PSF2 are provided in such a manner that the difference between the occupied areas thereof in planar view is inversely proportional to the difference between the thicknesses thereof. Therefore, the difference between the volumes of the one first pattern part PSF1 and the one second pattern part PSF2 is smaller as compared to a case in which the difference between the occupied areas thereof in planar view is not inversely proportional to the difference between the thicknesses thereof. It is preferable that the difference between the volumes of the one first pattern part PSF1 and the one second pattern part PSF2 is smaller. More preferably, the volume of the one first pattern part PSF1 is equal to that of the one second pattern part PSF2.

It should be noted that the thickness H1 of the one first pattern part PSF1 is equal to the film thickness of the portion where the one first pattern part PSF1 is formed in the first coating film PSF. The thickness H2 of the one second pattern part PSF2 is equal to the film thickness of the portion where the one second pattern part PSF2 is formed in the first coating film PSF. The thickness H1 of the one first pattern part PSF1 and the thickness H2 of the one second pattern part PSF2 are thicker than the maximum step difference H3 of the covered film CM sandwiched between the one first pattern part PSF1 and the one second pattern part PSF2.

Each of the first pattern parts PSF1 is formed using a mask pattern having, for example, the same dimension and shape. Each of the second pattern parts PSF2 is formed using a mask pattern having, for example, the same dimension and shape. Each of the first pattern parts PSF1 and the second pattern parts PSF2 can be formed as a pattern exposed under the same conditions using, for example, the same mask pattern and developed under the same conditions.

Figure 7:
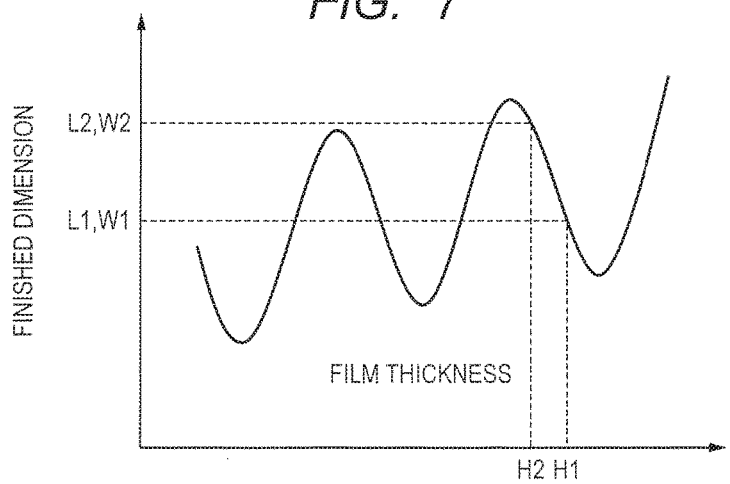
FIG. 7 is a graph for showing a relationship between the film thickness of a first coating film and the finished dimensions of first pattern parts and second pattern parts in the third step of the manufacturing method of the semiconductor device according to the first embodiment.

As shown in FIG. 7, the finished dimension value of the pattern exposed under the same conditions using the mask pattern having the same dimension and shape and developed under the same conditions is changed in a sign curve shape in accordance with the film thickness of the photosensitive film to be exposed. The horizontal axis of FIG. 7 represents the film thickness of the photosensitive film to be exposed. The vertical axis of FIG. 7 represents the finished dimension value (width and length) of the pattern. In this case, the film thickness (the thickness H1 of the first pattern part PSF1 and the thickness H2 of the second pattern part PSF2) of the first coating film PSF and the dimension value of each of the first pattern part PSF1 and the second pattern part PSF2 can be set on the basis of the swing curve shown in FIG. 7.

For example, the thicknesses H1 and H2 of the first pattern part PSF1 and the second pattern part PSF2 and the respective dimension values thereof are selected so as to satisfy the relationship on the region where the inclination of the swing curve shown in FIG. 7 is minus. Further, the thicknesses H1 and H2 of the first pattern part PSF1 and the second pattern part PSF2 and the respective dimension values thereof are selected in such a manner that the thicknesses H4 and H5 (see FIG. 8) of the first pattern part PSF1 and the second pattern part PSF2 deformed in the next step are equal to or larger than the maximum step difference H3 of the covered film CM.

Figure 8:
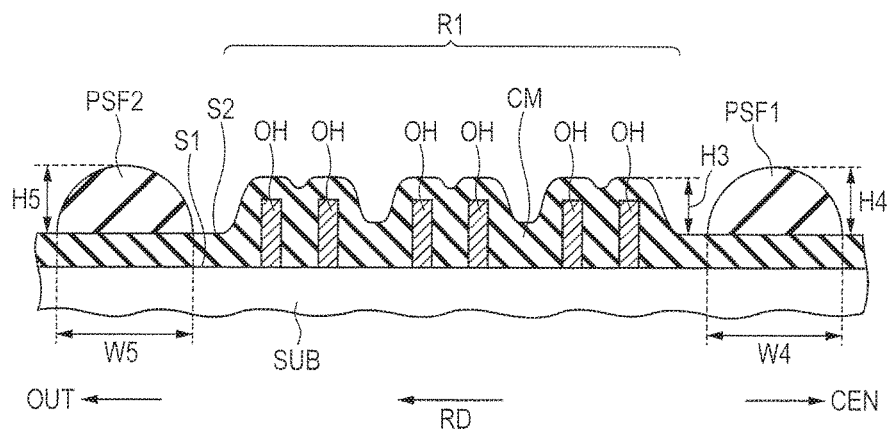
FIG. 8 is a cross-sectional view for showing a fourth step of the manufacturing method of the semiconductor device according to the first embodiment.

Next, as shown in FIG. 8, the first pattern parts PSF1 and the second pattern parts PSF2 are sagged (deformed) by heating. The first pattern parts PSF1 and the second pattern parts PSF2 are subjected to heat treatment or ultraviolet heat curing treatment (UV curing). Accordingly, the first pattern parts PSF1 and the second pattern parts PSF2 are deformed due to heat sagging, and are cured in a deformed state.

The thickness H4 of the one first pattern part PSF1 after the step becomes thinner than the thickness H1 of the one first pattern part PSF1 before the step. The length W4 of the one first pattern part PSF1 after the step becomes wider than the length W1 of the one first pattern part PSF1 before the step. The thickness H5 of the one second pattern part PSF2 after the step becomes thinner than the thickness H2 of the one second pattern part PSF2 before the step. The width W5 of the one second pattern part PSF2 after the step becomes wider than the width W2 of the one second pattern part PSF2 before the step. The cross-sectional shape of each of the first pattern parts PSF1 and the second pattern parts PSF2 along the radial direction RD is deformed from, for example, a rectangular shape to a rounded shape. The cross-sectional shape of each of the first pattern parts PSF1 and the second pattern parts PSF2 is preferably deformed to a semi-ellipse shape or a semicircular shape.

The difference between the thickness H4 of the one first pattern part PSF1 and the thickness H5 of the one second pattern part PSF2 after the step becomes smaller than the difference between the thickness H1 of the one first pattern part PSF1 and the thickness H2 of the one second pattern part PSF2 before the step. Namely, the difference between the thickness H4 and the thickness H5 after the step becomes smaller than the film thickness difference of the first coating film PSF. The thicknesses H4 and H5 are equal to or larger than the maximum step difference H3 of the covered film CM. The heat treatment condition or ultraviolet heat curing treatment condition in the step can be arbitrarily set as long as the above-described deformation occurs. However, the heating temperature is, for example, 100° C. or more and 200° C. or less.

Figure 9:
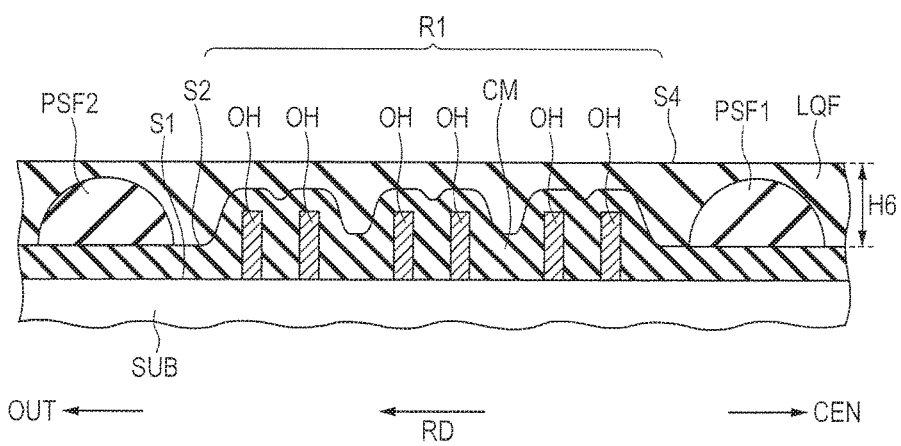
FIG. 9 is a cross-sectional view for showing a fifth step of the manufacturing method of the semiconductor device according to the first embodiment.

Next, as shown in FIG. 9, a second coating film LQF is formed on the main surface S1 of the semiconductor substrate SUB. The second coating film LQF is formed so as to cover the covered film CM, the first pattern part PSF1, and the second pattern part PSF2.

The second coating film LQF is configured using a material having fluidity to the extent that the irregularities formed by the covered film CM, the first pattern part PSF1, and the second pattern part PSF2 are buried and a flat upper surface S4 can be formed. Further, the second coating film LQF is configured using a material that can be etched at an etching rate equal to that of the covered film CM in an etch back process to be described later. The viscosity of the second coating film LQF is 100 cP or less, and is preferably 10 cP or less. The viscosity of the second coating film LQF is equal to or larger than, for example, that of the first coating film PSF.

The second coating film LQF may be configured using a material used for other applications in other steps of the manufacturing method of a semiconductor device. The second coating film LQF may contain a polyimide resin composition (for example, a composition used as a polyimide film) made mainly of polyimide. The second coating film LQF may contain a resin composition (for example, a composition used as an antireflective film (Bottom Anti-Reflective Coating or BARC)) containing, for example, polyvinyl carbazole, fluorene phenol novolac resin, fluoren naphthol novolac resin, or the like. The second coating film LQF may contain a photosensitive resin composition (for example, a composition used as a photoresist film) containing, for example, novolac resin, a naphthoquinone diazide compound, or the like. The second coating film LQF may contain a composition (for example, used as a gap fill material) containing, for example, an acrylic polymer or a methacrylic polymer. The material configuring the second coating film LQF may contain at least one selected from a group including of the above-described compositions. The second coating film LQF may be configured using, for example, only the antireflective film, or may be configured as a laminated film of the antireflective film and a photoresist film.

The second coating film LQF is applied on the main surface S1 of the semiconductor substrate SUB by a spin coating method. As shown in FIG. 9, the upper surface S4 of the second coating film LQF thus formed is formed flat on the region R1 sandwiched between at least the one first pattern part PSF1 and the one second pattern part PSF2.

As shown in FIG. 9, the film thickness H6 of the second coating film LQF is equal to or larger than the film thickness necessary to form the upper surface S4 of the second coating film LQF to be flat, and is thicker than the maximum step difference H3 of the covered film CM. The film thickness H6 of the second coating film LQF is thicker than, for example, the thickness H4 (see FIG. 8) of the first pattern part PSF1 and the thickness H5 (see FIG. 8) of the second pattern part PSF2. Here, the film thickness H6 of the second coating film LQF means the distance between the upper surface S4 of the second coating film LQF in which the upper surface S2 of the covered film CM is formed on the flat portion and the upper surface S2 in the perpendicular direction. The film thickness H6 of the second coating film LQF is, for example, 3 μm or less when the viscosity of the second coating film LQF is 100 cP or less, and is 0.3 μm or less when the viscosity of the second coating film LQF is 10 cP or less.

Figure 10:
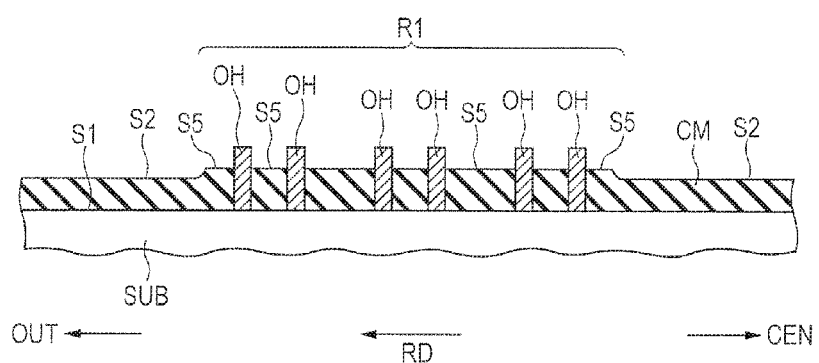
FIG. 10 is a cross-sectional view for showing a sixth step of the manufacturing method of the semiconductor device according to the first embodiment.

Next, as shown in FIG. 10, at least a part of the covered film CM and the second coating film LQF is removed. For example, plasma etching (etch back process) is performed for the main surface S1 of the semiconductor substrate SUB. The plasma etching is performed under the conditions in which the etching rate of the covered film CM is equal to that of the second coating film LQF and the etching rates of the first pattern part PSF1 and the second pattern part PSF2 are lower than those of the second coating film LQF and the covered film CM. The plasma etching is performed until a portion of each of the step parts OH is exposed on the covered film CM. The surface S5 of the covered film CM thus formed is formed as a plane along the shape of the upper surface S4 of the second coating film LQF shown in FIG. 9. The covered film CM covers a portion (including a portion of each of the step parts OH coupled to the main surface S1) of each of the step parts OH, and is processed to be a (flat) film whose height is uniform. Thereafter, the first pattern part PSF1, the second pattern part PSF2, and the second coating film LQF remaining on the main surface S1 are removed after the etch back process. Accordingly, as shown in FIG. 10, the semiconductor device including the step parts OH and the flat covered film CM covering a portion of each of the step parts OH can be obtained.

Next, the effect of the manufacturing method of the semiconductor device according to the first embodiment will be described. The manufacturing method of the semiconductor device according to the first embodiment is performed to obtain the semiconductor device including a (flat) covered film CM whose height is uniform. In the manufacturing method of the semiconductor device according to the first embodiment, first, the semiconductor substrate SUB having the main surface S1 and the region R1 where the step parts OH are formed on the main surface S1 is prepared. Next, the first coating film PSF made of photosensitive material having fluidity is formed by spin coating so as to cover the step parts OH and to be thick at the central part CEN of the semiconductor substrate SUB and thin at the outer peripheral part OUT in planar view. Next, the first pattern parts PSF1 located on the central part CEN side relative to the step parts OH in the radial direction RD of the semiconductor substrate SUB and the second pattern parts PSF2 located on the outer peripheral part OUT side relative to the step parts OH are formed by exposing and developing a part of the first coating film PSF. In this case, the first pattern parts PSF1 and the second pattern parts PSF2 are formed so that the occupied areas of the first pattern parts PSF1 in planar view become smaller than those of the second pattern parts PSF2 in planar view. Next, the first pattern parts PSF1 and the second pattern parts PSF2 are sagged by heating. Next, the second coating film LQF made of material having fluidity is formed by spin coating so as to cover the step parts OH. Next, at least a part of the second coating film LQF is removed.

In the manufacturing method of the semiconductor device in the past, in the case where the fluidity material is spin-coated in a state where the first pattern parts PSF1 and the second pattern parts PSF2 are not formed, the fluidity material dropped on the central part side relative to the step parts is dammed by the step parts, and is likely to remain on the central part side relative to the step parts. Further, the fluidity material dropped on the outer peripheral part side relative to the step parts or flowing out from the central part side to the outer peripheral part side is likely to wet and spread on a region where the step parts are not formed by being subjected to centrifugal force. As a result, the film thickness of the coating film formed on the central part side relative to the step parts is likely to become thicker than that of the coating film formed on the outer peripheral part side relative to the step parts.

On the contrary, according to the manufacturing method of the semiconductor device according to the first embodiment, the first pattern parts PSF1 located on the central part CEN side relative to the step parts OH and the second pattern parts PSF2 located on the outer peripheral part OUT side relative to the step parts OH are formed in the step of forming the second coating film LQF. The fluidity material configuring the second coating film LQF flows mainly along the radial direction RD by spin coating. Namely, the first pattern parts PSF1 and the second pattern parts PSF2 are formed before and after the step parts OH in the flowing direction the fluidity material.

Accordingly, the amount of the fluidity material supplied and remaining on the step parts OH can be controlled by the first pattern parts PSF1 and the second pattern parts PSF2. The first pattern parts PSF1 can suppress excessive supply of the fluidity material from the central part CEN side relative to the first pattern parts PSF1. The second pattern parts PSF2 can suppress excessive outflow of the fluidity material to the outer peripheral part OUT side relative to the second pattern parts PSF2. As a result, a variation in the film thickness of the second coating film LQF formed on the region R1 in the radial direction RD is suppressed as compared to that in the manufacturing method of the semiconductor device in the past.

Namely, according to the manufacturing method of the semiconductor device according to the first embodiment, the flatness of the upper surface S4 of the second coating film LQF formed on the step parts OH is improved as compared to the manufacturing method of the semiconductor device in the past. Therefore, the flatness (the uniformity of the distance between the surface S5 and the main surface S1) of the surface S5 of the covered film CM having been subjected to the etch back process using the second coating film LQF is improved as compared to that of the covered film formed by the manufacturing method of the semiconductor device in the past.

Further, according to the manufacturing method of the semiconductor device according to the first embodiment, the difference between the volume of the first pattern part PSF1 and the volume of the second pattern part PSF2 can be made as small as possible. Specifically, since the first coating film PSF is formed by spin coating, the film thickness of the first coating film PSF formed on the region located on the central part CEN side relative to the region R1 becomes thicker than that of the first coating film PSF formed on the region located on the outer peripheral part OUT side relative to the region R1. Therefore, the first pattern part PSF1 and the second pattern part PSF2 are formed so that the thickness of the first pattern part PSF1 is thicker than that of the second pattern part PSF2 in the step of forming the first pattern part PSF1 and the second pattern part PSF2. The first pattern part PSF1 and the second pattern part PSF2 are formed so that the occupied area of the first pattern part PSF1 in planar view is smaller than that of the second pattern part PSF2 in planar view in the step of forming the first pattern part PSF1 and the second pattern part PSF2. Each of the occupied areas of the first pattern part PSF1 and the second pattern part PSF2 is set so that the difference between the volumes thereof becomes small in consideration of the difference (variation in the film thickness of the first coating film PSF in the radial direction RD) between the thicknesses thereof.

When the first pattern part PSF1 and the second pattern part PSF2 having a small difference in volume are sagged (deformed) by heating, the first pattern part PSF1 and the second pattern part PSF2 are deformed to the same shape under the same degree of surface tension. Accordingly, the difference between the thickness H4 of the first pattern part PSF1 and the thickness H5 of the second pattern part PSF2 after deformation can be smaller than the difference between the thickness H1 of the first pattern part PSF1 and the thickness H2 of the second pattern part PSF2 before deformation.

Therefore, a variation in the film thickness of the second coating film LQF, in the radial direction RD, formed between the first pattern part PSF1 and the second pattern part PSF2 after deformation is smaller as compared to that of the second coating film LQF formed between the first pattern part PSF1 and the second pattern part PSF2 formed without considering the volume difference.

Namely, according to the manufacturing method of the semiconductor device according to the first embodiment, the flatness of the upper surface S4 of the second coating film LQF formed on the step parts OH is improved as compared to the manufacturing method of the semiconductor device in which the first pattern part PSF1 and the second pattern part PSF2 are formed without considering the volume difference. Therefore, the flatness (the uniformity of the distance between the surface S5 and the main surface S1) of the surface S5 of the covered film CM having been subjected to the etch back process using the second coating film LQF is improved as compared to that of the covered film formed by the manufacturing method of the semiconductor device.

Further, the first pattern part PSF1 and the second pattern part PSF2 can be easily removed from the semiconductor substrate SUB after the etch back process. Therefore, according to the manufacturing method of the semiconductor device according to the first embodiment, a region for forming a structure is not needed, and the semiconductor device can be downsized as compared to a case in which the structure for reducing the film thickness difference of the second coating film LQF is formed so as to remain on the semiconductor device that can be finally obtained. Further, since the first pattern part PSF1 and the second pattern part PSF2 can be easily removed in the manufacturing method of the semiconductor device according to the first embodiment, the formation regions of the first pattern part PSF1 and the second pattern part PSF2 are particularly limited. Therefore, the manufacturing method of the semiconductor device according to the first embodiment can be applied regardless of the arrangement of patterns on the main surface S1. For example, the manufacturing method of the semiconductor device according to the first embodiment can be easily applied to the existing manufacturing method of the semiconductor device without changing the design of the existing semiconductor device.

It should be noted that the flatness of the second coating film LQF can be improved by making the film thickness of the second coating film LQF sufficiently thicker than the maximum step difference H3 of the covered film CM without suppressing the outflow of the second coating film LQF as described above. In this case, however, there is a problem that the etching time of the second coating film LQF becomes long, and thus the manufacturing cost of the semiconductor device is increased. Further, the difference between the film thickness of a portion located on the central part CEN side in the second coating film LQF and the film thickness of a portion located on the outer peripheral part OUT side in the second coating film LQF becomes larger as compared to that of the second coating film LQF formed by the manufacturing method of the semiconductor device according to the first embodiment. On the contrary, in the manufacturing method of the semiconductor device according to the first embodiment, the flatness of the second coating film LQF can be improved without making the film thickness of the second coating film LQF sufficiently thicker than the maximum step difference H3 of the covered film CM by the first pattern part PSF1 and the second pattern part PSF2. Therefore, according to the manufacturing method of the semiconductor device according to the first embodiment, it is possible to obtain the semiconductor device having the covered film CM with the improved flatness without increasing the manufacturing cost.

In the step of deforming the first pattern part PSF1 and the second pattern part PSF2, it is preferable that the first pattern part PSF1 and the second pattern part PSF2 are subjected to heat treatment or ultraviolet heat curing treatment. Accordingly, the thickness H4 of the first pattern part PSF1 and the thickness H5 of the second pattern part PSF2 after the treatment can be easily reduced than the thickness H1 of the first pattern part PSF1 and the thickness H2 of the second pattern part PSF2 before the treatment.

In the step of deforming the first pattern part PSF1 and the second pattern part PSF2, it is preferable that the cross-sectional shape of each of the first pattern part PSF1 and the second pattern part PSF2 in the radial direction RD is a semi-ellipse shape or a semicircular shape. The first pattern part PSF1 and the second pattern part PSF2 can be easily formed in such a manner that the first pattern part PSF1 and the second pattern part PSF2 each having a rectangular cross-sectional shape in the radial direction RD are subjected to heat treatment or ultraviolet heat curing treatment.

In the step of forming the first pattern part PSF1 and the second pattern part PSF2, a plurality of first pattern parts PSF1 and a plurality of second pattern parts PSF2 are formed. By forming the first pattern parts PSF1, excessive supply of the fluidity material from the central part CEN side can be suppressed as compared to a case in which only one first pattern part PSF1 is formed. By forming the second pattern parts PSF2, excessive outflow of the fluidity material to the outer peripheral part OUT side can be suppressed as compared to a case in which only one second pattern part PSF2 is formed. As a result, a variation in the film thickness of the second coating film LQF, in the radial direction RD, formed on the region R1 in this case can be suppressed as compared to a case in which only one first pattern part PSF1 and one second pattern part PSF2 are formed.

In the step of forming the first pattern part PSF1 and the second pattern part PSF2, it is preferable that the first pattern parts PSF1 and the second pattern parts PSF2 are formed so as to intermittently surround the step parts OH. In this case, as shown in FIG. 5, the first pattern parts PSF1 can be classified into, for example, a first group of first pattern parts PSF1 intermittently formed in a first direction intersecting the radial direction RD and a second group of first pattern parts PSF1 intermittently formed in a second direction intersecting the radial direction RD and the first direction. As similar to the above, the second pattern parts PSF2 can be classified into, for example, a first group of second pattern parts PSF2 intermittently formed in the first direction and a second group of second pattern parts PSF2 intermittently formed in the second direction. One of the first group of first pattern parts PSF1 and one of the second group of second pattern parts PSF2 are formed so as to sandwich at least one of the step parts OH in the radial direction RD. One of the second group of first pattern parts PSF1 and one of the first group of second pattern parts PSF2 are formed so as to sandwich at least the other one of the step parts OH in the radial direction RD.

Accordingly, even in the case where the fluidity material configuring the second coating film LQF flows along the direction intersecting the radial direction RD in the step of forming the second coating film LQF, the first pattern part PSF1 and the second pattern part PSF2 are formed before and after the step parts OH in the direction in which the fluidity material flows. The second coating film LQF formed on the region R1 surrounded by the first pattern part PSF1 and the second pattern part PSF2 has a high degree of flatness.

It is preferable that the first pattern part PSF1, the second pattern part PSF2, and the second coating film LQF are provided to have a small difference in thickness. It is preferable that the thickness H4 of the first pattern part PSF1 and the thickness H5 of the second pattern part PSF2 are, for example, 1.3 times or less than the film thickness H6 of the second coating film LQF. Accordingly, an abnormality (unevenness of the film thickness, repellency, or the like) of the second coating film LQF in the region R1 located relatively close to the first pattern part PSF1 and the second pattern part PSF2 can be suppressed as compared to, for example, a case in which the thickness H4 and the thickness H5 are about twice the film thickness H6.

It should be noted that the film thickness H6 (see FIG. 9) of the second coating film LQF is thicker than the thickness H4 (see FIG. 8) of the first pattern part PSF1 and the thickness H5 (see FIG. 8) of the second pattern part PSF2, but is not limited to this. The film thickness H6 of the second coating film LQF may be thinner than the thickness H4 of the first pattern part PSF1 and the thickness H5 of the second pattern part PSF2. In this case, the film thickness H6 of the second coating film LQF is thinner than the film thickness of the first coating film PSF. Even in such a case, the amount of the fluidity material configuring the second coating film LQF that is supplied and remaining on the region R1 can be suppressed by the first pattern part PSF1 and the second pattern part PSF2. As a result, a variation in the film thickness of the second coating film LQF formed on the region R1 in the radial direction RD is suppressed as compared to the manufacturing method of the semiconductor device in the past. The film thickness of the first coating film PSF and the dimension values of the first pattern part PSF1 and the second pattern part PSF2 can be set in consideration of the swing curve mainly shown in FIG. 7 regardless of the magnitude relationship with the film thickness of the second coating film LQF.

The viscosity of the second coating film LQF is 100 cP or less. Accordingly, the second coating film LQF can be buried in the irregularities formed by the step parts OH, and can make the upper surface S4 flat. Therefore, such a second coating film LQF is suitable for a mask film for an etch back process. It is preferable that the viscosity of the second coating film LQF is 10 cP or less. Accordingly, the second coating film LQF can be easily buried in the irregularities formed by the step parts OH, and can further make the upper surface S4 flat. Therefore, the covered film CM having a uniform height and a high degree of flatness can be formed by performing the etch back process for the covered film CM using the second coating film LQF.

It should be noted that the distance between the first pattern part PSF1 and the step parts OH in the radial direction RD and the distance between the second pattern part PSF2 and the step parts OH in the radial direction RD can be set in accordance with, for example, the maximum step difference H3 of the covered film CM and the viscosity of the second coating film LQF. For example, if the shortest distance between the first pattern part PSF1 and one of the step parts OH located nearest to the central part CEN side in the radial direction RD is too long, the effect obtained by forming the first pattern part PSF1 is deteriorated. If the shortest distance between the second pattern part PSF2 and one of the step parts OH located nearest to the outer peripheral part OUT side in the radial direction RD is too long, the effect obtained by forming the second pattern part PSF2 is deteriorated.

(Second Embodiment)

Next, a manufacturing method of a semiconductor device according to a second embodiment will be described with reference to FIG. 11 to FIG. 16. The manufacturing method of the semiconductor device according to the second embodiment basically has the same configuration as that according to the first embodiment, but is different in that a plurality of step parts is sparsely and densely arranged on a semiconductor substrate SUB.

Figure 11:
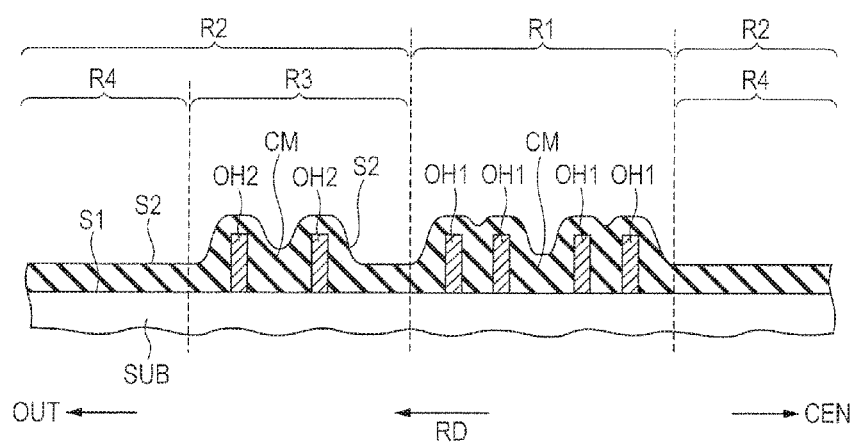
FIG. 11 is a cross-sectional view for showing a semiconductor substrate in a first step of a manufacturing method of a semiconductor device according to a second embodiment.

As shown in FIG. 11, the semiconductor substrate SUB includes a first region R1 (first step region) and a second region R2 (second step region). In the first region R1, a plurality of first step parts OH1 is formed. The second region R2 has a third region R3 in which a plurality of second step parts OH2 more sparsely arranged than the first step parts OH1 is formed and a fourth region R4 in which no step parts are formed. The first region R1, the second region R2, the third region R3, and the fourth region R4 can be arbitrarily arranged in the radial direction RD.

As shown in FIG. 11, the first region R1 and the second region R2 are adjacent to each other. The second regions R2 are formed so as to surround, for example, the first region R1 in the radial direction RD. In the second region R2, the third region R3 and the fourth region R4 may be formed at arbitrary positions. For example, as shown in FIG. 11, the third region R3 is adjacent to the first region R1, and the fourth region R4 is formed at a position further apart from the first region R1 than the third region R3.

It should be noted that the second region R2 may include at least one of the third region R3 and the fourth region R4. The second region R2 may include only the fourth region R4, and no step parts may be formed in the second region R2 (the details will be described later).

As shown in FIG. 11, the first step parts OH1 and the second step parts OH2 are formed in a convex shape with respect to a main surface S1, and have, for example, the same structure. It should be noted that the first step parts OH1 and the second step parts OH2 may have different structures. The shortest interval between the adjacent first step parts OH1 is shorter than that between the adjacent second step parts OH2. In addition, the interval between the first step part OH1 and the second step part OH2 that are adjacent to each other across the boundary between the first region R1 and the second region R2 is longer than that between the adjacent first step parts OH1 in the first region R1.

As shown in FIG. 11, a covered film CM is formed on the main surface S1 of the semiconductor substrate SUB. The covered film CM is formed so as to cover the first step parts OH1 and the second step parts OH2. Irregularities according to the first step parts OH1 are formed in the covered film CM formed in the first region R1. Irregularities according to the second step parts OH2 are formed in the covered film CM formed in the third region R3 of the second region R2.

Figure 12:
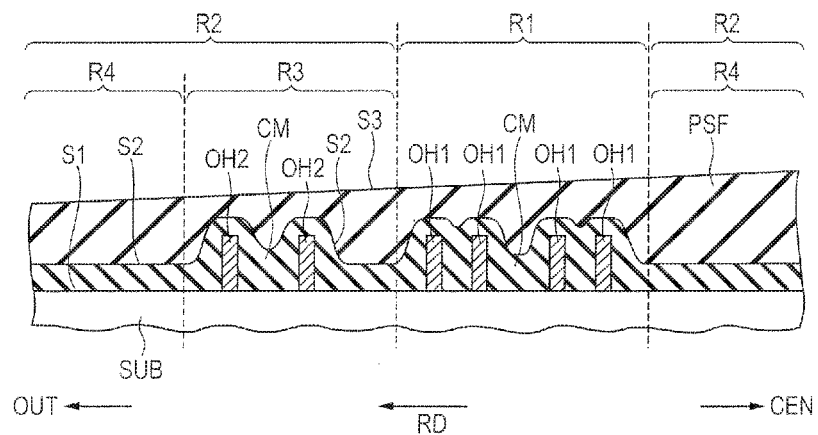
FIG. 12 is a cross-sectional view for showing the semiconductor substrate in a second step of the manufacturing method of the semiconductor device according to the second embodiment.

Next, as shown in FIG. 12, a first coating film PSF is formed so as to cover the entire upper surface S2 of the covered film CM. The first coating film PSF is formed on the first region R1 and the second region R2. The film thickness of the first coating film PSF is thicker than the maximum step difference H3 of the covered film CM.

The film thickness of the first coating film PSF differs depending on a position in the radial direction RD. The film thickness of a portion of the first coating film PSF formed on the fourth region R4 located on the central part CEN side relative to the first step parts OH1 and the second step parts OH2 is thicker than that of the other portion of the first coating film PSF formed on the fourth region R4 located on the outer peripheral part OUT side relative to the first step parts OH1 and the second step parts OH2.

Figure 13:
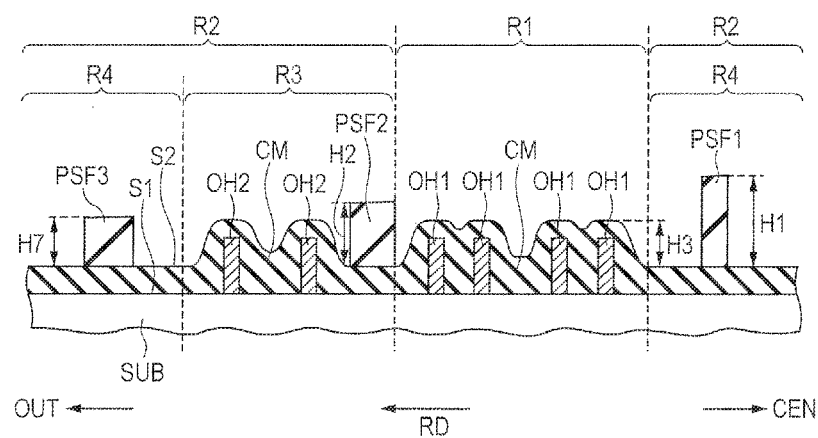
FIG. 13 is a cross-sectional view for showing the semiconductor substrate in a third step of the manufacturing method of the semiconductor device according to the second embodiment.

Next, as shown in FIG. 13, a portion of the first coating film PSF is exposed and developed to form a plurality of first pattern parts PSF1, a plurality of second pattern parts PSF2, and a plurality of third pattern parts PSF3. Each of the first pattern parts PSF1 is formed on, for example, the fourth region R4. Each of the second pattern parts PSF2 is formed on, for example, the third region R3. The second pattern parts PSF2 are formed on the outer peripheral part OUT side relative to the first step parts OH1 and on the central part CEN side relative to the third step parts OH3 in the radial direction RD. Each of the third pattern parts PSF3 is formed on, for example, the fourth region R4. Each of the third pattern parts PSF3 is formed on the outer peripheral part OUT side relative to the first step parts OH1 and the second step parts OH2 in the radial direction RD. The first pattern parts PSF1, the second pattern parts PSF2, and the third pattern parts PSF3 are formed in order at intervals from the central part CEN side toward the outer peripheral part OUT side in the radial direction RD.

One of the first pattern parts PSF1 and one of the second pattern parts PSF2 are formed so as to sandwich at least one of the first step parts OH1 in the radial direction RD. One of the second pattern parts PSF2 and one of the third pattern parts PSF3 are formed so as to sandwich at least one of the second step parts OH2 in the radial direction RD. One of the first pattern parts PSF1 and one of the third pattern parts PSF3 are formed so as to sandwich at least one of the first step parts OH1 and at least one of the second step parts OH2 in the radial direction RD.

The volume difference among the one first pattern part PSF1, the one second pattern part PSF2, and the one third pattern part PSF3 is preferably smaller. It should be noted that the film thickness of the first coating film PSF and the respective dimension values of the first pattern parts PSF1, the second pattern parts PSF2, and the third pattern parts PSF3 can be set similarly to those in the manufacturing method of the semiconductor device according to the first embodiment. Namely, the occupied area of the one first pattern part PSF1 in planar view is smaller than that of the one second pattern part PSF2 in planar view. The occupied area of the one second pattern part PSF2 in planar view is smaller than that of the one third pattern part PSF3 in planar view. As shown in FIG. 13, the thickness H1 of the one first pattern part PSF1 is thicker than the thickness H2 of the one second pattern part PSF2. The thickness H2 of the one second pattern part PSF2 is thicker than the thickness H7 of the one third pattern part PSF3.

Figure 14:
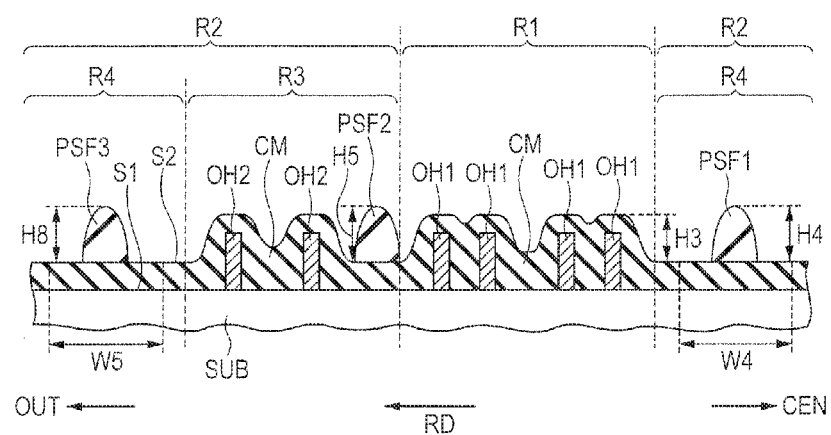
FIG. 14 is a cross-sectional view for showing the semiconductor substrate in a fourth step of the manufacturing method of the semiconductor device according to the second embodiment.

Next, as shown in FIG. 14, the first pattern parts PSF1, the second pattern parts PSF2, and the third pattern parts PSF3 are deformed and cured. The difference among the thickness H4 of the one first pattern part PSF1, the thickness H5 of the one second pattern part PSF2, and the thickness H8 of the one third pattern part PSF3 after the step becomes smaller than that among the thickness H1 of the one first pattern part PSF1, the thickness H2 of the one second pattern part PSF2, and the thickness H7 of the one third pattern part PSF3 before the step. The thicknesses H4, H5, and H8 are equal to or larger than the maximum step difference H3 of the covered film CM.

Figure 15:
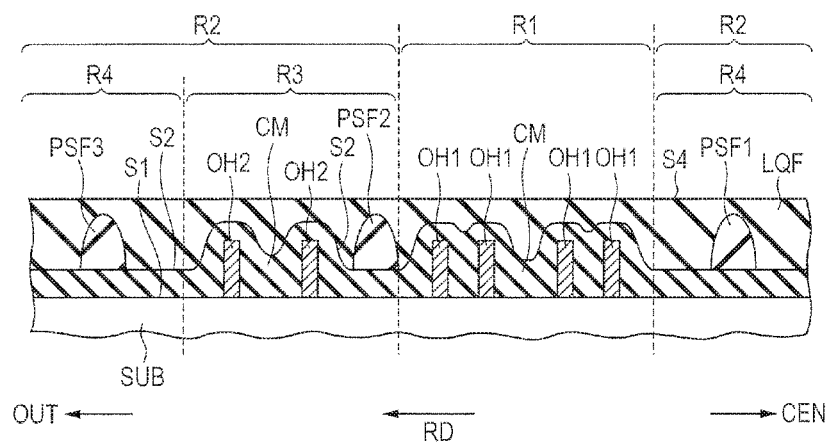
FIG. 15 is a cross-sectional view for showing the semiconductor substrate in a fifth step of the manufacturing method of the semiconductor device according to the second embodiment.

Next, as shown in FIG. 15, a second coating film LQF is formed on the main surface S1 of the semiconductor substrate SUB. The second coating film LQF is formed so as to cover the covered film CM, the first pattern part PSF1, the second pattern part PSF2, and the third pattern part PSF3.

Figure 16:
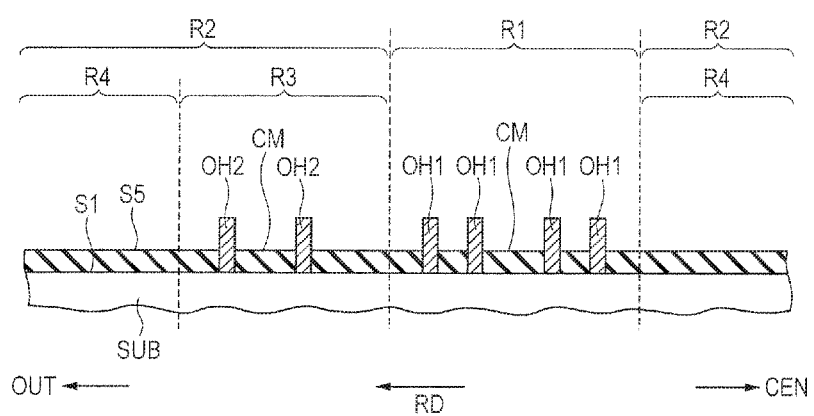
FIG. 16 is a cross-sectional view for showing the semiconductor substrate in a sixth step of the manufacturing method of the semiconductor device according to the second embodiment.

Next, as shown in FIG. 16, at least portions of the covered film CM and the second coating film LQF are removed. The covered film CM covers a portion (including a portion of each of the first step parts OH1 coupled to the main surface S1) of each of the first step parts OH1 in the first region R1, and is processed to be a (flat) film whose height is uniform. Further, the covered film CM covers a portion (including a portion of each of the second step parts OH2 coupled to the main surface S1) of each of the second step parts OH2 in the third region R3, and is processed to be a (flat) film whose height is uniform.

The manufacturing method of the semiconductor device according to the second embodiment basically has the same configuration as that according to the first embodiment, and thus has the same effect as that according to the first embodiment.

Specifically, in the case where a semiconductor substrate having a first region and a second region is used in the manufacturing method of the semiconductor device in the past, the fluidity material formed on the main surface thereof by spin coating is likely to flow from the first region to the second region. Therefore, the height of the upper surface of a part on the first region located near the second region in the coating film made of the fluidity material becomes lower with respect to the main surface as compared to a part on the first region formed at a position further apart from the second region.

On the contrary, according to the manufacturing method of the semiconductor device according to the second embodiment, the third pattern part PSF3 is formed between the first step parts OH1 formed relatively densely and the second step parts OH2 formed relatively sparsely in the step of forming the second coating film LQF. Therefore, the fluidity material configuring the second coating film LQF can be suppressed from flowing from the first region R1 to the second region R2.

Further, according to the manufacturing method of the semiconductor device according to the second embodiment, since the first pattern part PSF1 and the third pattern part PSF3 are formed so that the volume difference thereof becomes small, the flatness of the upper surface S4 of the second coating film LQF formed on the first step parts OH1 is improved as compared to the manufacturing method of the semiconductor device in which the first pattern part PSF1 and the third pattern part PSF3 are formed without considering the volume difference thereof. Therefore, the flatness of the surface S5 of the covered film CM having been subjected to the etch back process using the second coating film LQF is improved as compared to that of the covered film formed by the manufacturing method of the semiconductor device.

Further, according to the manufacturing method of the semiconductor device according to the second embodiment, since the second pattern part PSF2 and the third pattern part PSF3 are formed so that the volume difference thereof becomes small, the flatness of the upper surface S4 of the second coating film LQF formed on the second step parts OH2 is improved as compared to the manufacturing method of the semiconductor device in which the second pattern part PSF2 and the third pattern part PSF3 are formed without considering the volume difference thereof.

In addition, since the first pattern part PSF1, the second pattern part PSF2, and the third pattern part PSF3 are formed so that the volume difference thereof becomes small, the flatness of the upper surface S4 of the second coating film LQF formed on the first step parts OH1 and the second step parts OH2 is improved as compared to the manufacturing method of the semiconductor device in which these are formed without considering the volume difference thereof. In other words, the flatness of the upper surface S4 of the second coating film LQF is improved irrespective of the density of the step parts. Therefore, the flatness of the surface S5 of the covered film CM having been subjected to the etch back process using the second coating film LQF is improved as compared to that of the covered film formed by the manufacturing method of the semiconductor device.

<Concrete Example>

Next, a concrete example of the manufacturing method of the semiconductor device according to the first and second embodiments will be described with reference to FIG. 17 to FIG. 24. The concrete example is a manufacturing method of a semiconductor device having a flash memory.

Figure 17:
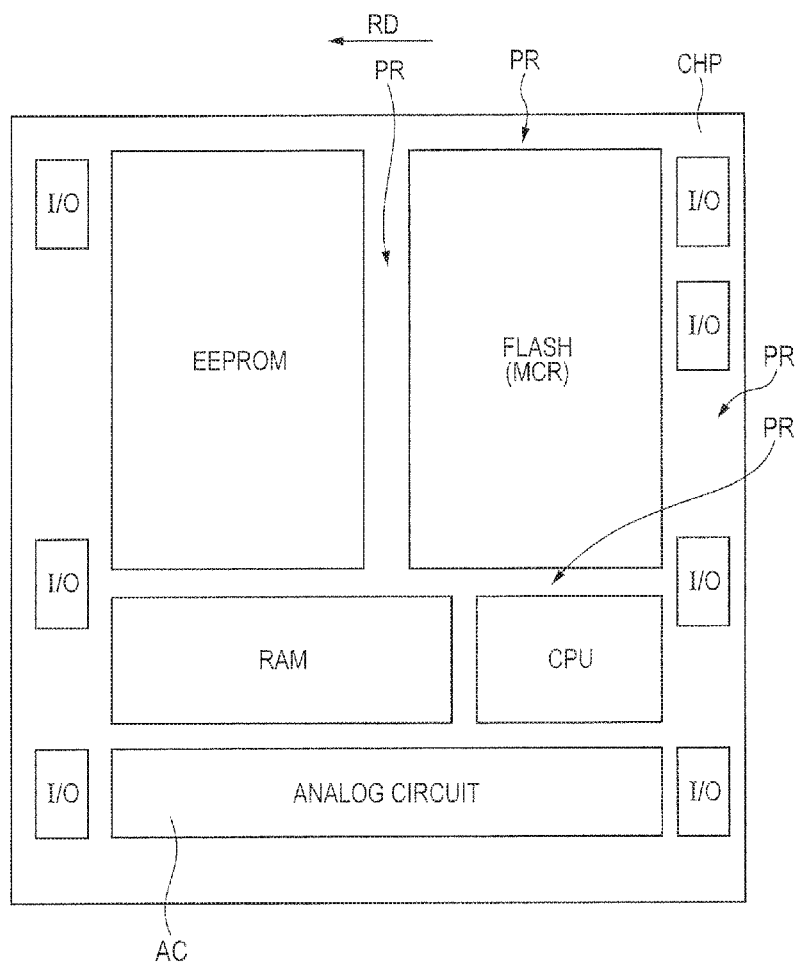
FIG. 17 is a plan view for showing a layout of a semiconductor chip according to a concrete example.

As shown in FIG. 17, a semiconductor chip CHP has a CPU (Central Processing Unit), a RAM (Random Access Memory), an analog circuit AC, an EEPROM (Electrically Erasable Programmable Read Only Memory), a flash memory FLASH, and an I/O (Input/Output) circuit. A plurality of semiconductor chips CHP is formed on the semiconductor substrate SUB by the manufacturing method of the semiconductor device shown in FIG. 18 to FIG. 25. The semiconductor chips CHP are formed in the radial direction RD. Hereinafter, on the semiconductor substrate SUB, a region where the flash memory FLASH is finally formed is referred to as a memory cell formation region MCR and a region other than the region where, for example, a transistor is formed is referred to as a peripheral region PR.

Figure 18:
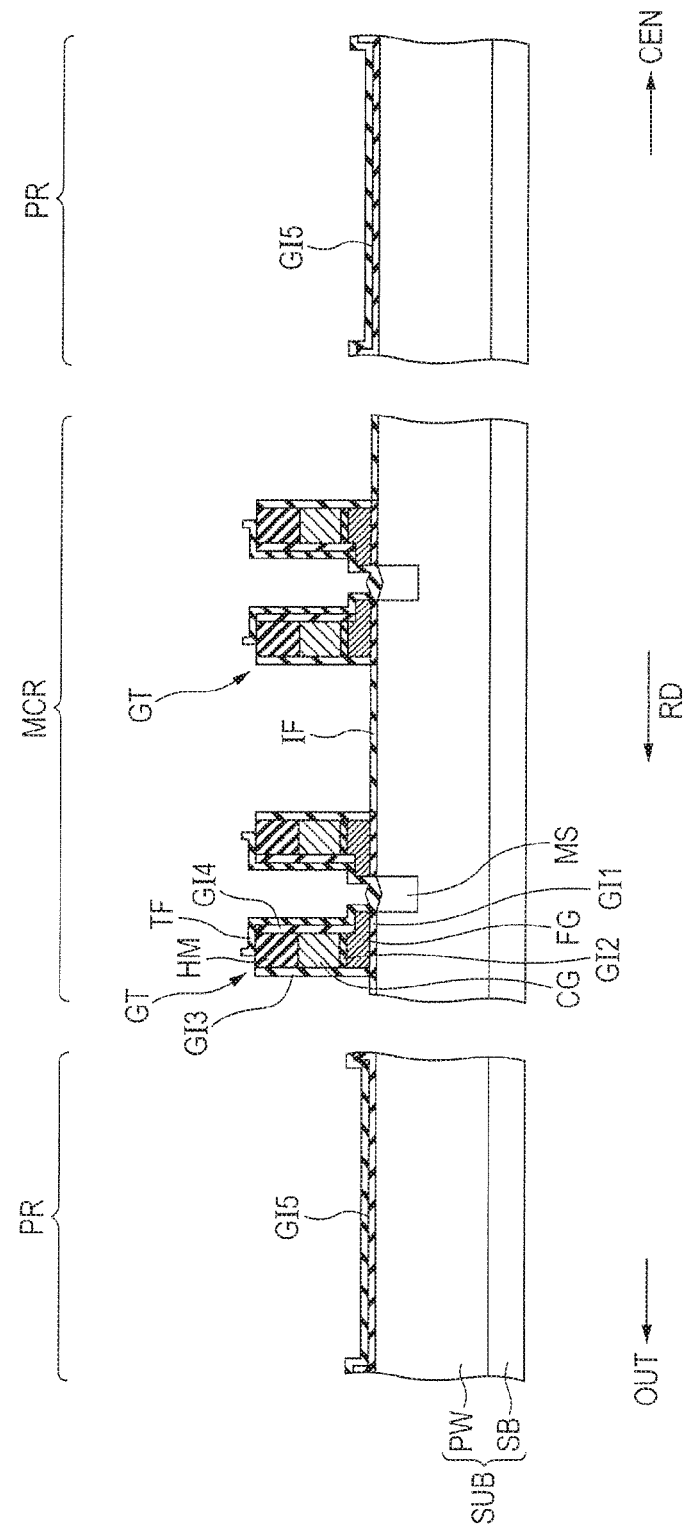
FIG. 18 is a cross-sectional view for showing a first step of a manufacturing method of a semiconductor device according to the concrete example.

First, as shown in FIG. 18, the semiconductor substrate SUB in which a plurality of memory cells is formed is prepared in the memory cell formation region MCR as the first region R1 (see FIG. 11 to FIG. 16). One memory cell has a plurality of pairs of gate electrode structures GT as the step parts OH (see FIG. 2 to FIG. 10) and the first step parts OH1 (see FIG. 11 to FIG. 16). A plurality of memory cell formation regions MCR and a plurality of peripheral regions PR as the fourth region R4 (see FIG. 11 to FIG. 16) are formed in the radial direction RD. In other words, the memory cell formation region MCR is sandwiched between the peripheral regions PR in the radial direction RD.

The semiconductor substrate SUB includes a substrate SB made of, for example, single-crystal silicon (Si) and a p-type well PW formed up to a predetermined depth from the main surface S1 by injecting p-type impurities into the substrate SB. One memory source region MS is formed for each memory cell in the main surface S1 of the semiconductor substrate SUB. The gate electrode structure GT has a first gate insulating film GI1, a floating gate electrode FG, a second gate insulating film GI2, a control gate electrode CG, a hard mask layer HM, side wall gate insulating films GI3 and GI4, and a tunnel insulating film TM. A pair of gate electrode structures GT is configured using two gate electrode structures GT arranged on the main surface S1 while sandwiching the memory source region MS.

Specifically, a plurality of floating gate electrodes FG is formed on the main surface S1 via the first gate insulating film GI1 in the memory cell formation region MCR. Two floating gate electrodes FG are arranged so as to sandwich one memory source region MS. The first gate insulating film GI1 is configured using a simple substance such as a silicon oxide film ($SiO_2$), a silicon nitride film ($Si_3N_4$), or an arbitrary combination thereof. The floating gate electrode FG is made of conductive material. The floating gate electrode FG is made of, for example, polycrystalline silicon with impurities introduced (hereinafter, referred to as doped polysilicon).

The control gate electrode CG is formed on a portion of each floating gate electrode FG via the second gate insulating film GI2. The second gate insulating film GI2 is configured using a simple substance such as a silicon oxide film, a silicon nitride film, or an arbitrary combination thereof. The control gate electrode CG is made of conductive material. The control gate electrode CG is made of, for example, doped polysilicon.

The hard mask layer HM is formed on each control gate electrode CG. The hard mask layer HM is configured using, for example, a silicon nitride film.

The side wall gate insulating films GI3 and GI4 are formed so as to cover the side walls of each floating gate electrode FG and each control gate electrode CG. Each of the side wall gate insulating films GI3 and GI4 is configured using a simple substance such as a silicon oxide film, a silicon nitride film, or an arbitrary combination thereof.

The tunnel insulating film TM is formed on the memory source region MS and the pairs of floating gate electrodes FG, control gate electrodes CG, hard mask layers HM, and side wall gate insulating films GI4 all of which are formed so as to sandwich the memory source region MS. The tunnel insulating film TM is configured using a simple substance such as a silicon oxide film, a silicon nitride film, or an arbitrary combination thereof.

Further, an insulating film IF is formed so as to cover the main surface S1 between the pair of gate electrode structures GT (the step parts OH or the first step parts OH1). The insulating film IF is configured using a simple substance such as a silicon oxide film, a silicon nitride film, or an arbitrary combination thereof.

High step parts such as the gate electrode structures GT are not formed in the peripheral regions PR of the semiconductor substrate SUB. A third gate insulating film GI5 is formed in each peripheral region PR. It should be noted that the second step parts OH2 (see FIG. 11 to FIG. 16) may be formed in each peripheral region PR, or step parts lower than the gate electrode structures GT may be formed.

Figure 19:
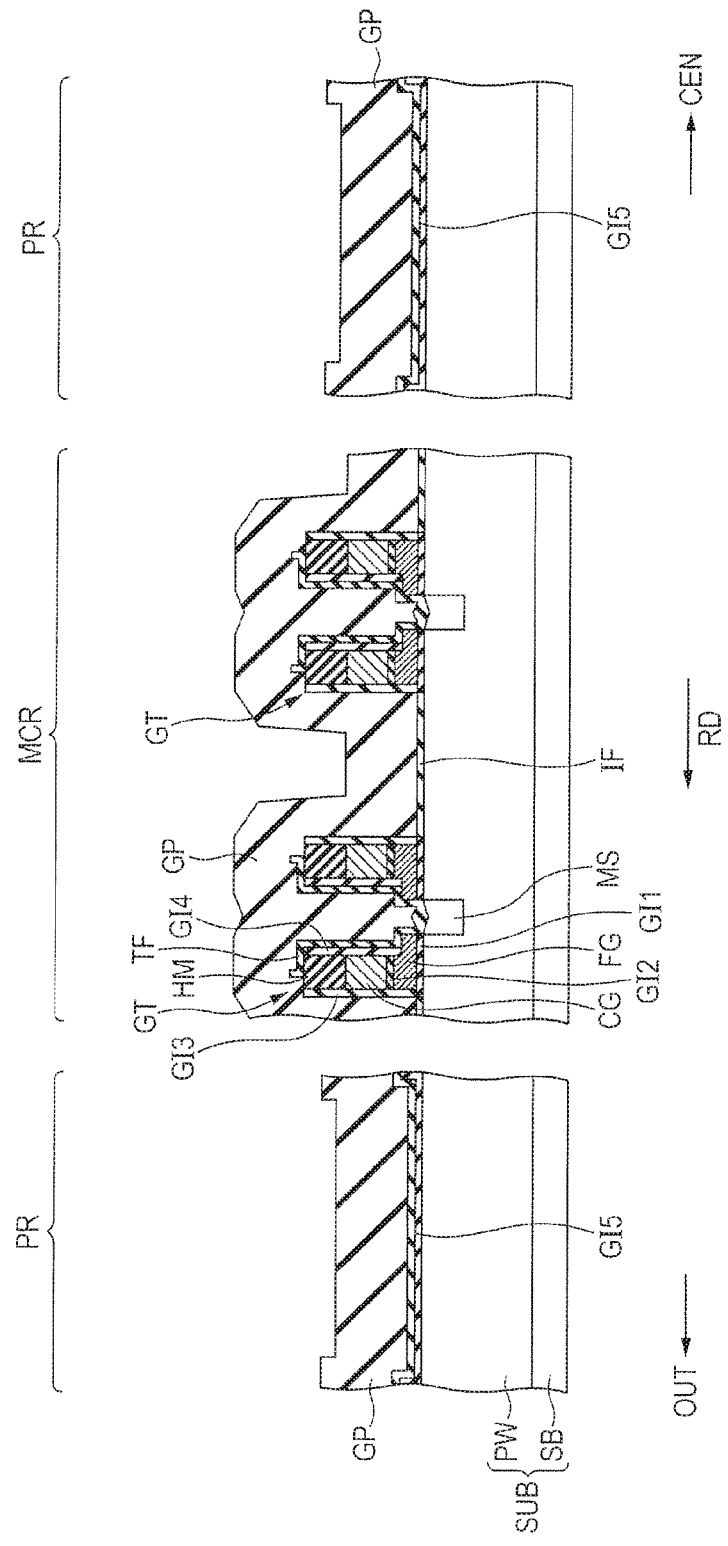
FIG. 19 is a cross-sectional view for showing a second step of the manufacturing method of the semiconductor device according to the concrete example.

Next, as shown in FIG. 19, a polysilicon film GP (a film to be processed or the covered film CM) is formed on the entire surface of the semiconductor substrate SUB. In the memory cell formation region MCR, the polysilicon film GP is formed so as to cover the gate electrode structures GT. The polysilicon film GP is formed by, for example, a CVD method or the like, and well adheres to the gate electrode structures GT. The polysilicon film GP has a relatively large irregular shape in accordance with the gate electrode structures GT in the memory cell formation region MCR. On the other hand, the polysilicon film GP has a relatively small irregular shape in accordance with the third gate insulating film GI5 in each peripheral region PR. The maximum step difference H3 of the polysilicon film GP in the memory cell formation region MCR is formed as a step corresponding to the gate electrode structures GT.

Figure 20:
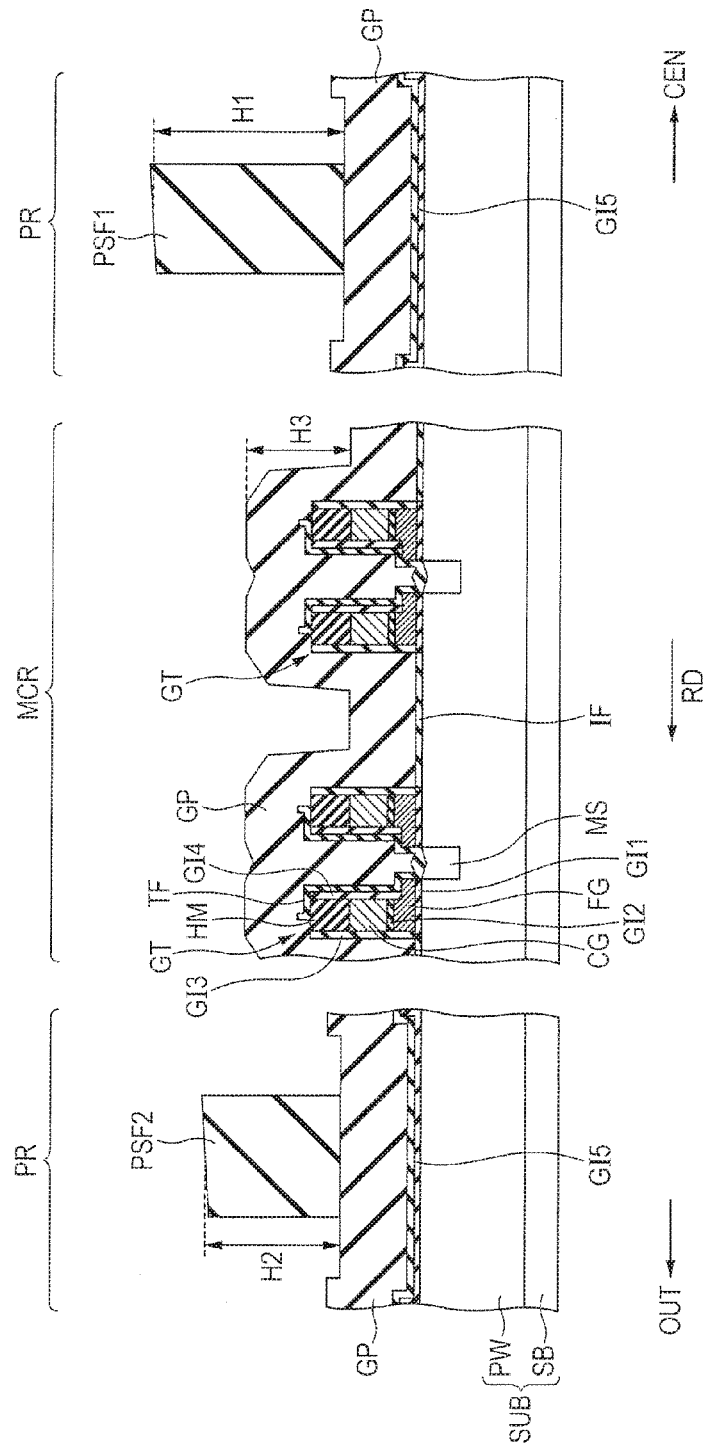
FIG. 20 is a cross-sectional view for showing a third step of the manufacturing method of the semiconductor device according to the concrete example.

Next, as shown in FIG. 20, a plurality of first pattern parts PSF1 and a plurality of second pattern parts PSF2 are formed on the peripheral regions PR. First, a first coating film PSF is formed on the memory cell formation region MCR and the peripheral regions PR. The first coating film PSF is, for example, a photoresist film that is a photosensitive resin composition containing novolak resin, a naphthoquinone diazide compound, or the like, or a photosensitive polyimide film containing a photosensitive agent that is a polyimide resin composition. The first coating film PSF is spin-coated on the main surface S1 of the semiconductor substrate SUB by a spinner or the like. The film thickness of the first coating film PSF formed on the peripheral region PR located on the central part CEN side relative to the memory cell formation region MCR is thicker than that of the first coating film PSF formed on the peripheral region PR located on the outer peripheral part OUT side relative to the memory cell formation region MCR.

Next, the first pattern parts PSF1 and the second pattern parts PSF2 are formed on the peripheral regions PR by exposing and developing a portion of the first coating film PSF. The first pattern parts PSF1 are formed on the peripheral region PR located on the central part CEN side relative to the memory cell formation region MCR. The second pattern parts PSF2 are formed on the peripheral region PR located on the outer peripheral part OUT side relative to the memory cell formation region MCR. The film thickness of the first coating film PSF, namely, the thickness of each of the first pattern parts PSF1 and the second pattern parts PSF2 is equal to or larger than the maximum step difference H3 of the polysilicon film GP. The first pattern parts PSF1 and the second pattern parts PSF2 are formed so as to surround, for example, the memory cell formation region MCR.

One of the first pattern parts PSF1 and one of the second pattern parts PSF2 formed so as to sandwich at least one of the gate electrode structures GT in the radial direction RD have the same relationship as the manufacturing method of the semiconductor device according to the first embodiment.

The occupied area of the one first pattern part PSF1 in planar view is smaller than that of the one second pattern part PSF2 in planar view. The length L1 of the one first pattern part PSF1 in the direction intersecting the radial direction RD is shorter than the length L2 of the one second pattern part PSF2 in the direction intersecting the radial direction RD. The length W1 of the one first pattern part PSF1 in the radial direction RD is narrower than the length W2 of the one second pattern part PSF2 in the radial direction RD. The thickness H1 of the one first pattern part PSF1 is thicker than the thickness H2 of the one second pattern part PSF2.

Namely, the one first pattern part PSF1 and the one second pattern part PSF2 are provided in such a manner that the difference between the occupied areas thereof is inversely proportional to the difference between the thicknesses thereof. Therefore, the difference between the volumes of the one first pattern part PSF1 and the one second pattern part PSF2 is smaller as compared to a case in which the difference between the occupied areas thereof is not inversely proportional to the difference between the thicknesses thereof. It is preferable that the difference between the volumes of the one first pattern part PSF1 and the one second pattern part PSF2 is smaller. More preferably, the volume of the one first pattern part PSF1 is equal to that of the one second pattern part PSF2.

Figure 21:
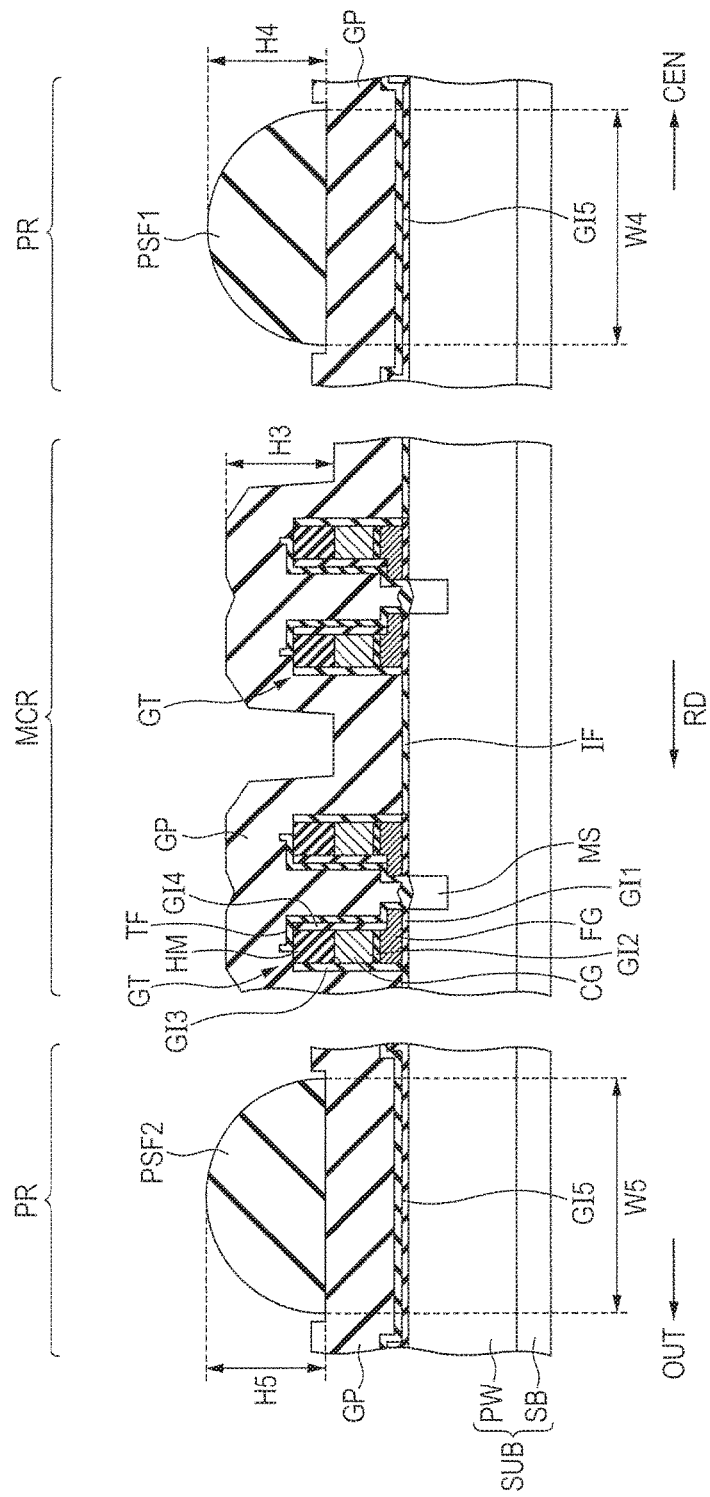
FIG. 21 is a cross-sectional view for showing a fourth step of the manufacturing method of the semiconductor device according to the concrete example.

Next, as shown in FIG. 21, the first pattern parts PSF1 and the second pattern parts PSF2 are subjected to heat treatment or ultraviolet heat curing treatment (UV curing). The treatment is carried out in such a manner that the first pattern parts PSF1 and the second pattern parts PSF2 are sagged by heating so that the thicknesses H4 and H5 thereof after the treatment are thinner than the thicknesses H1 and H2 before the treatment. The thickness H4 of the first pattern part PSF1 and the thickness H5 of the second pattern part PSF2 after the treatment are equal to or larger than the maximum step difference H3 of the polysilicon film GP. The cross-sectional shape of each of the first pattern parts PSF1 and the second pattern parts PSF2 along the radial direction RD after the treatment is, for example, a semicircular shape or a semi-ellipse shape.

Figure 22:
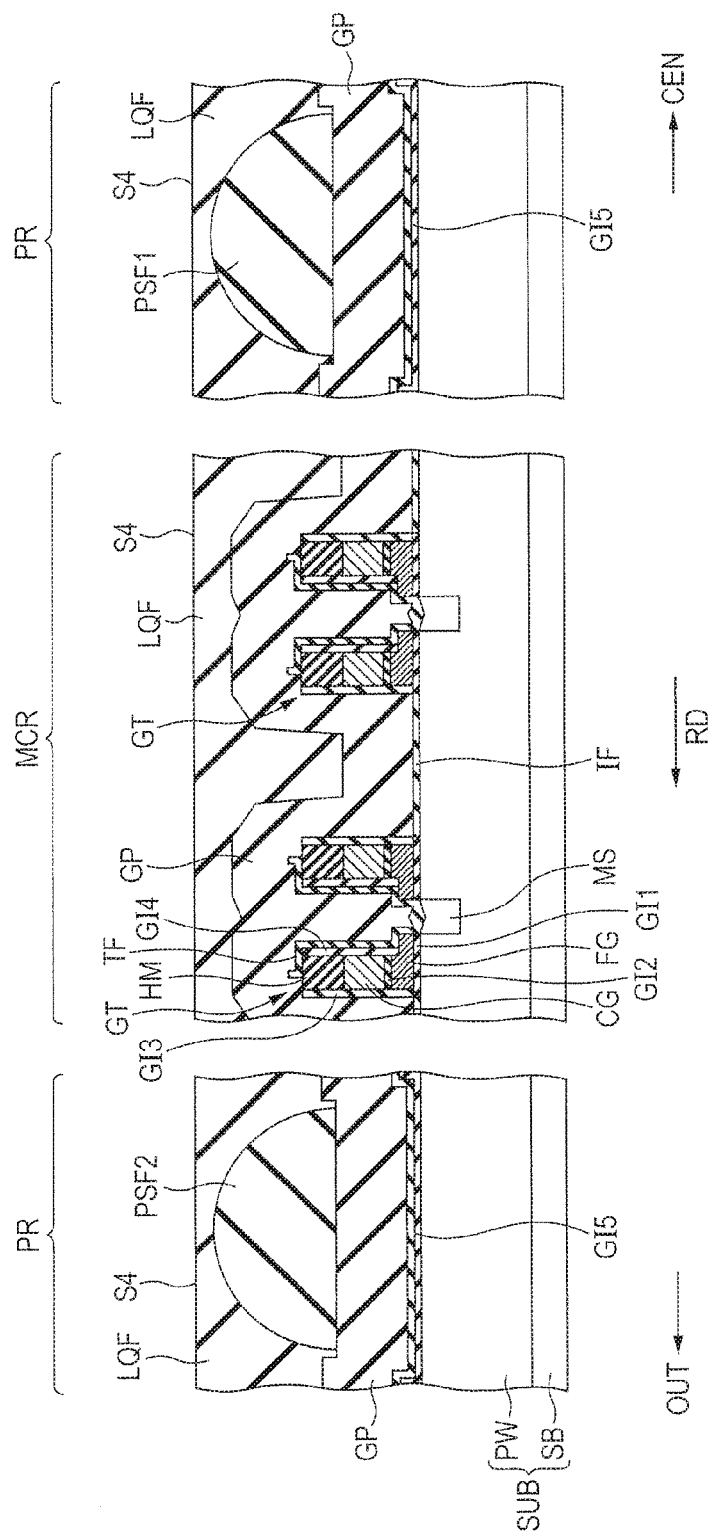
FIG. 22 is a cross-sectional view for showing a fifth step of the manufacturing method of the semiconductor device according to the concrete example.

Next, as shown in FIG. 22, a second coating film LQF made of fluidity material is formed on the main surface S1 of the semiconductor substrate SUB. The material configuring the second coating film LQF is a non-photosensitive material having no photosensitivity, and contains a resin composition (for example, a composition used as an antireflective film (BARC)) containing, for example, polyvinyl carbazole, fluorene phenol novolac resin, fluoren naphthol novolac resin, or the like. The fluidity material configuring the second coating film LQF is applied onto the main surface S1 of the semiconductor substrate SUB by a spinner or the like.

In this case, the fluidity material configuring the second coating film LQF is applied so as to bury the irregularities of the polysilicon film GP resulting from the gate electrode structures GT and the irregularities formed by the irregularities of the polysilicon film GP, the first pattern parts PSF1, and the second pattern parts PSF2, and the outflow toward the outer peripheral part OUT side of the semiconductor substrate SUB is suppressed.

As a result, a variation in the film thickness of the second coating film LQF formed on the memory cell formation regions MCR formed on the semiconductor substrate SUB in the radial direction RD is smaller as compared to that in the manufacturing method of the semiconductor device in the past. In addition, a variation in the film thickness of the second coating film LQF formed in one memory cell formation region MCR in the radial direction RD is smaller as compared to that in the manufacturing method of the semiconductor device in the past.

Namely, according to the manufacturing method of the semiconductor device according to the concrete example, the flatness (the uniformity of the distance between the upper surface S4 and the main surface S1) of the upper surface S4 of the second coating film LQF can be improved even in one memory cell formation region MCR and even among the memory cell formation regions MCR formed on one semiconductor substrate SUB as compared to the manufacturing method of the semiconductor device in the past.

Figure 23:
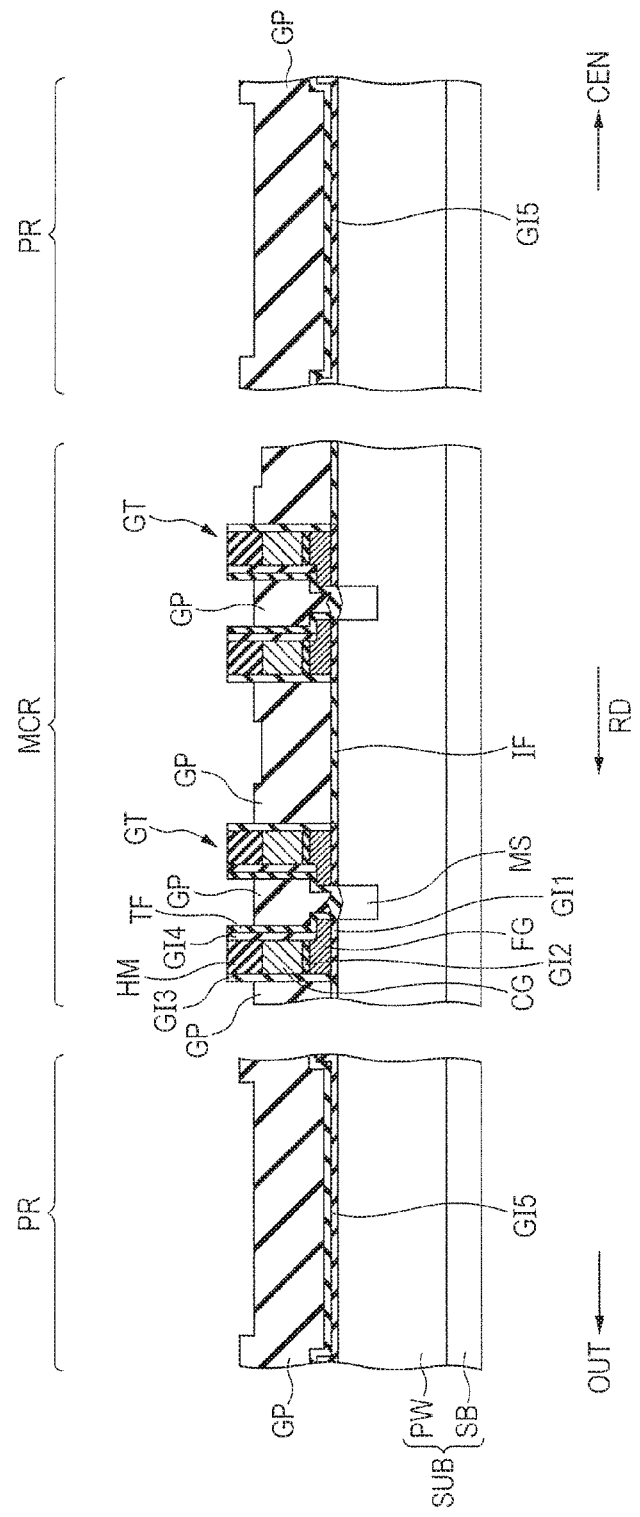
FIG. 23 is a cross-sectional view for showing a sixth step of the manufacturing method of the semiconductor device according to the concrete example.

Next, as shown in FIG. 23, a plasma etching process is performed for the entire surface of the main surface S1 of the semiconductor substrate SUB. A protective film (not shown) is preferably formed before the plasma etching process to protect a region other than the memory cell formation region MCR from the plasma etching process. The protective film has an opening on the memory cell formation region MCR. The material configuring the protective film is, for example, a resist. The opening of the protective film is formed by, for example, photoengraving. In this case, since the material configuring the second coating film LQF is a non-photosensitive material, the second coating film LQF is not affected by the step of forming the protective film.

The conditions of the plasma etching process are conditions under which the second coating film LQF and the polysilicon film GP can be etched at the same etching rate and the etching rate of the second coating film LQF and the polysilicon film GP is faster than that of each material configuring the gate electrode structures GT. Accordingly, the polysilicon film GP is subjected to an etch back process in the memory cell formation region MCR. In this case, since the upper surface S4 of the second coating film LQF is formed flat, the surface of the polysilicon film GP formed by the etch back process has the same flatness as the shape of the upper surface S4 of the second coating film LQF. Namely, the film thickness (the height with respect to the main surface S1) of the polysilicon film GP formed at a position adjacent to the peripheral region PR in the memory cell formation region MCR is equal to the film thickness (height) of the polysilicon film GP formed at a position apart from the peripheral region PR than the position. The surface of the polysilicon film GP formed by the etch back process is formed, for example, between two hard mask layers HM configuring the pair of gate electrode structures GT. Next, the second coating film LQF, the first pattern parts PSF1, and the second pattern parts PSF2 remaining in the memory cell region MCR and the peripheral regions PR are selectively removed. The removing process is performed by, for example, a wet etching process. Accordingly, the structure shown in FIG. 23 is formed.

Thereafter, the planarized polysilicon film GP is processed as described above. Specifically, the polysilicon film GP located on a region to be a memory drain region MD (see FIG. 24) in the memory cell formation region MCR and on regions to be a source region SR (see FIG. 24) and a drain region DR (see FIG. 24) in the peripheral region PR is removed.

Thereafter, impurities are ion-implanted from the main surface S1 side of the semiconductor substrate SUB using the polysilicon film GP as a mask. Accordingly, a so-called LDD (Light Doped Drain) region (see FIG. 24) is formed in the memory cell formation region MCT. Further, a low concentration source region SR1 and a low concentration drain region DR1 are formed in each peripheral region PR.

Thereafter, a sidewall insulating film SW (see FIG. 24) is formed so as to cover the side wall opposite to the side wall facing the floating gate electrode FG in a selection gate electrode SG. Further, the sidewall insulating films SW (see FIG. 24) are formed so as to cover the side walls of a gate electrode GM. The sidewall insulating film SW is configured using a simple substance such as a silicon oxide film, a silicon nitride film, or an arbitrary combination thereof.

Figure 24:
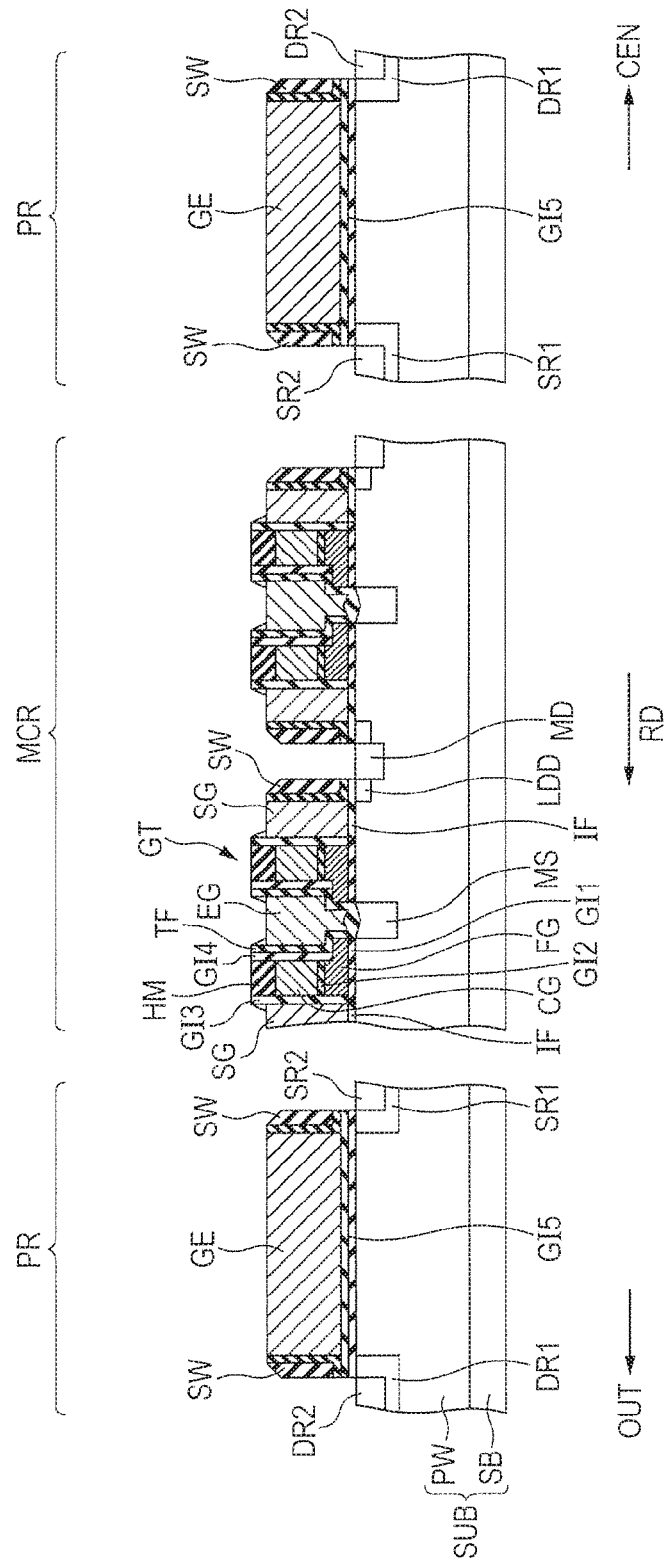
FIG. 24 is a cross-sectional view for showing a seventh step of the manufacturing method of the semiconductor device according to the concrete example.

Further, impurities are ion-implanted from the main surface S1 side of the semiconductor substrate SUB using the sidewall insulating film SW as a mask. Accordingly, the memory drain region MD (see FIG. 24) having an impurity concentration higher than that of the LDD region is formed in the memory cell formation region MCT. Further, a high concentration source region SR2 (see FIG. 24) having an impurity concentration higher than that of the low concentration source region SR1 and a high concentration drain region DR2 (see FIG. 24) having an impurity concentration higher than that of the low concentration drain region DR1 are formed in each peripheral region PR. Accordingly, the main parts of the semiconductor device are formed in the memory cell formation region MCR and the peripheral regions PR as shown in FIG. 24. It should be noted that the manufacturing method of the semiconductor device according to the first embodiment is suitable for the manufacturing method of the semiconductor device having the flash memory as shown in the concrete example, and is also suitable for a manufacturing method of an arbitrary semiconductor device having the first region R1 and the second region R2.

(Third Embodiment)

Next, a manufacturing method of a semiconductor device according to a third embodiment will be described with reference to FIG. 25 to FIG. 30. The manufacturing method of the semiconductor device according to the third embodiment basically has the same configuration as that according to the second embodiment, but is different in that a film to be processed in the etch back process is not the covered film CM (see FIG. 2 to FIG. 10) but a plurality of first step parts OH1 and a plurality of second step parts OH2.

Figure 25:
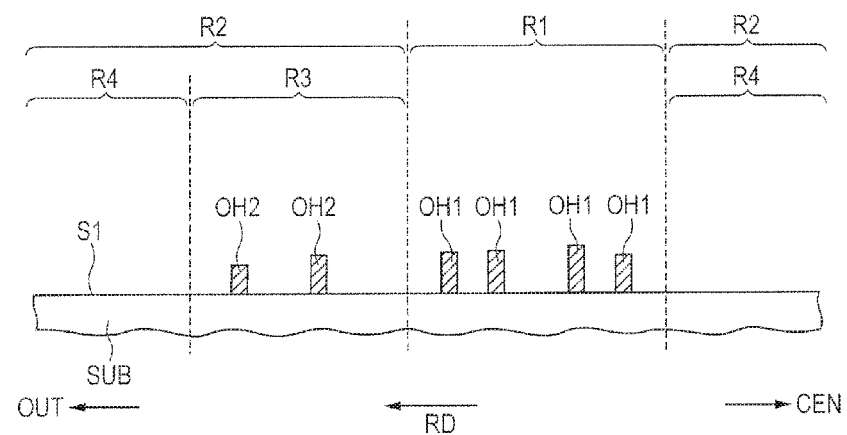
FIG. 25 is a cross-sectional view for showing a first step of a manufacturing method of a semiconductor device according to a third embodiment.

First, as shown in FIG. 25, a semiconductor substrate SUB having a plurality of first step parts OH1 and a plurality of second step parts OH2 is prepared. The semiconductor substrate SUB basically has the same configuration as that of the second embodiment, but is different in that the heights of the first step parts OH1 and the second step parts OH2 with respect to the main surface S1 are not uniform and the covered film CM is not formed. Next, a first coating film PSF is formed so as to surround a first region R1.

Figure 26:
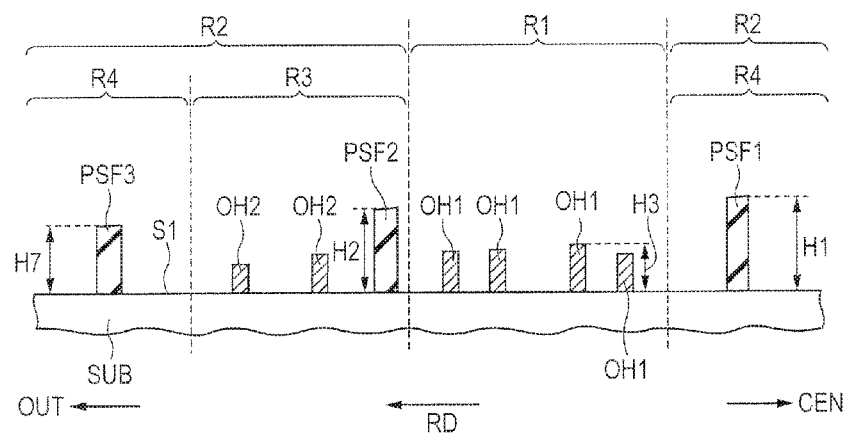
FIG. 26 is a cross-sectional view for showing a second step of the manufacturing method of the semiconductor device according to the third embodiment.

Next, as shown in FIG. 26, a first pattern part PSF1, a second pattern part PSF2, and a third pattern part PSF3 are formed by exposing and developing a portion of the first coating film PSF. The first pattern part PSF1, the second pattern part PSF2, and the third pattern part PSF3 basically have the same configurations as those of the second embodiment.

Namely, the occupied area of the one first pattern part PSF1 in planar view is smaller than that of the one second pattern part PSF2 in planar view. The occupied area of the one second pattern part PSF2 in planar view is smaller than that of the one third pattern part PSF3 in planar view. The thickness H1 of the one first pattern part PSF1 is thicker than the thickness H2 of the one second pattern part PSF2. The thickness H2 of the one second pattern part PSF2 is thicker than the thickness H7 of the one third pattern part PSF3.

Each of the first pattern parts PSF1, the second pattern parts PSF2, and the third pattern parts PSF3 is exposed under the same conditions using, for example, the same mask pattern, and can be formed as a pattern developed under the same conditions.

Figure 27:
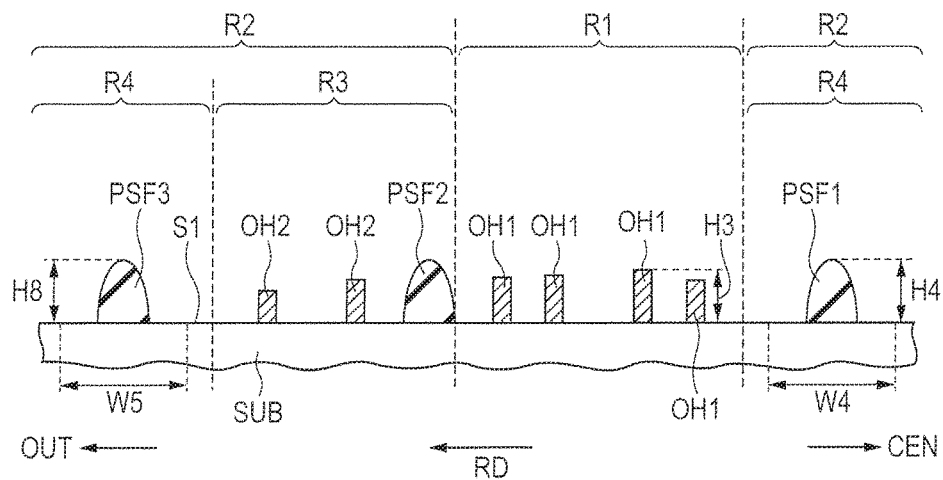
FIG. 27 is a cross-sectional view for showing a third step of the manufacturing method of the semiconductor device according to the third embodiment.

Next, as shown in FIG. 27, the first pattern parts PSF1, the second pattern parts PSF2, and the third pattern parts PSF3 are deformed and cured. The difference among the thickness H4 of the one first pattern part PSF1, the thickness H5 of the one second pattern part PSF2, and the thickness H8 of the one third pattern part PSF3 after the step becomes smaller than that among the thickness H1 of the one first pattern part PSF1, the thickness H2 of the one second pattern part PSF2, and the thickness H7 of the one third pattern part PSF3 before the step. The thicknesses H4, H5, and H8 are equal to or larger than the maximum step difference H3 of the covered film CM.

Figure 28:
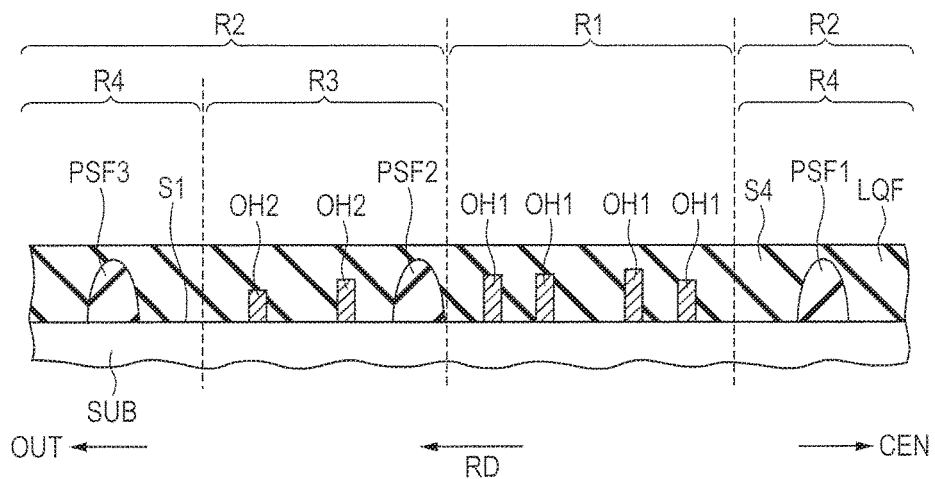
FIG. 28 is a cross-sectional view for showing a fourth step of the manufacturing method of the semiconductor device according to the third embodiment.

Next, as shown in FIG. 28, a second coating film LQF is formed on the main surface S1 of the semiconductor substrate SUB. The second coating film LQF is formed so as to cover the covered film CM, the first pattern part PSF1, the second pattern part PSF2, and the third pattern part PSF3. The upper surface S4 of the second coating film LQF is formed flat on the step parts OH formed in the first region R1 and the second region R2.

Figure 29:
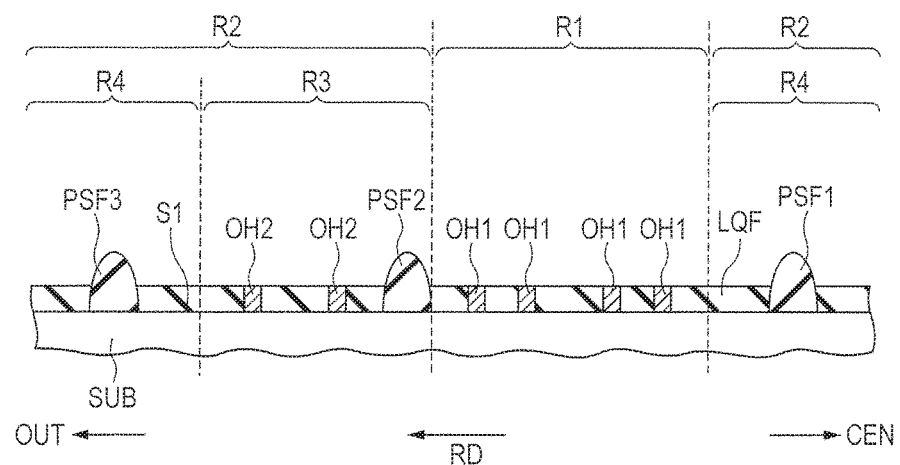
FIG. 29 is a cross-sectional view for showing a fifth step of the manufacturing method of the semiconductor device according to the third embodiment.

Next, as shown in FIG. 29, portions of the first step parts OH1, the second step parts OH2, and the second coating film LQF are removed. For example, plasma etching (etch back process) is performed for the main surface S1 of the semiconductor substrate SUB. The plasma etching is performed under the condition that the etching rate of the first step parts OH1 and the second step parts OH2 is equal to that of the second coating film LQF. The plasma etching is performed so that the first step parts OH1 and the second step parts OH2 as films to be processed have a predetermined height with respect to the main surface S1. The upper surface of the first step parts OH1 and the second step parts OH2 thus formed is along the shape of the upper surface S4 of the second coating film LQF. Therefore, the heights of the first step parts OH1 and the second step parts OH2 with respect to the main surface S1 are equalized by the etch back process in the first region R1 and the second region R2.

Figure 30:
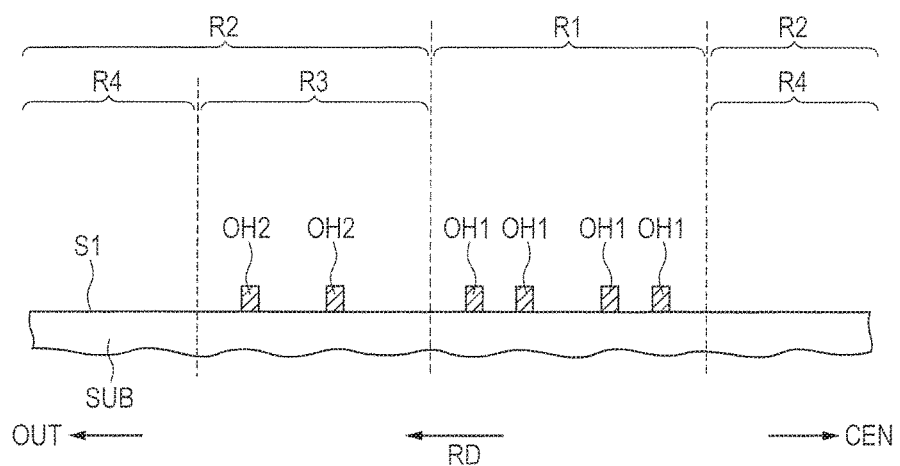
FIG. 30 is a cross-sectional view for showing a sixth step of the manufacturing method of the semiconductor device according to the third embodiment.

Next, as shown in FIG. 30, the first coating film PSF and the second coating film LQF remaining after the etch back process are removed. Accordingly, the semiconductor device including the first step parts OH1 and the second step parts OH2 (films to be processed) with the heights equalized can be obtained.

<Modified Example>

Next, a modified example of the manufacturing method of the semiconductor device according to the first to third embodiments will be described.

Each of a plurality of first pattern parts PSF1, second pattern parts PSF2, and third pattern parts PSF3 may be formed using, for example, mask patterns that are different from each other. A first mask pattern (not shown) and a second mask pattern (not shown) whose occupied area in planar view is larger than that of the first mask pattern may be formed in a photomask used in the step of forming the first pattern parts PSF1 and the second pattern parts PSF2. In this case, the difference between the dimension values of the first mask pattern and the second mask pattern in planar view is equal to or smaller than the difference between the finished dimension values of patterns that can vary on the swing curve shown in FIG. 7 on the basis of the film thickness difference of the first coating film PSF. Even in such a case, the first pattern parts PSF1 can be easily formed by the first mask pattern whose occupied area in planar view is relatively small, and the second pattern parts PSF2 can be easily formed by the second mask pattern whose occupied area in planar view is relatively large. These occupied areas can be controlled so that the difference between the volumes of the first pattern parts PSF1 and the second pattern parts PSF2 becomes as small as possible. Such a method is preferable in the case where the difference between the volumes cannot be made sufficiently small by the dimension values of the first pattern parts PSF1 and the second pattern parts PSF2 that are set in consideration of the film thickness distribution of the first coating film PSF and the swing curve shown in FIG. 7.

The material configuring the first coating film PSF may be a positive type photosensitive material or a negative type photosensitive material. In any of the cases, the film thickness of the first coating film PSF can be easily and properly controlled under the coating conditions by a spin coating method or the like. Therefore, the dimension values of the first pattern parts PSF1 and the second pattern parts PSF2 can be easily and properly controlled on the basis of the swing curve shown in FIG. 7.

The length L1 of the first pattern part PSF1 may be equal to the length L2 of the second pattern part PSF2 as long as the width W1 of the first pattern part PSF1 is wider than the width W2 of the second pattern part PSF2.

Figure 31:
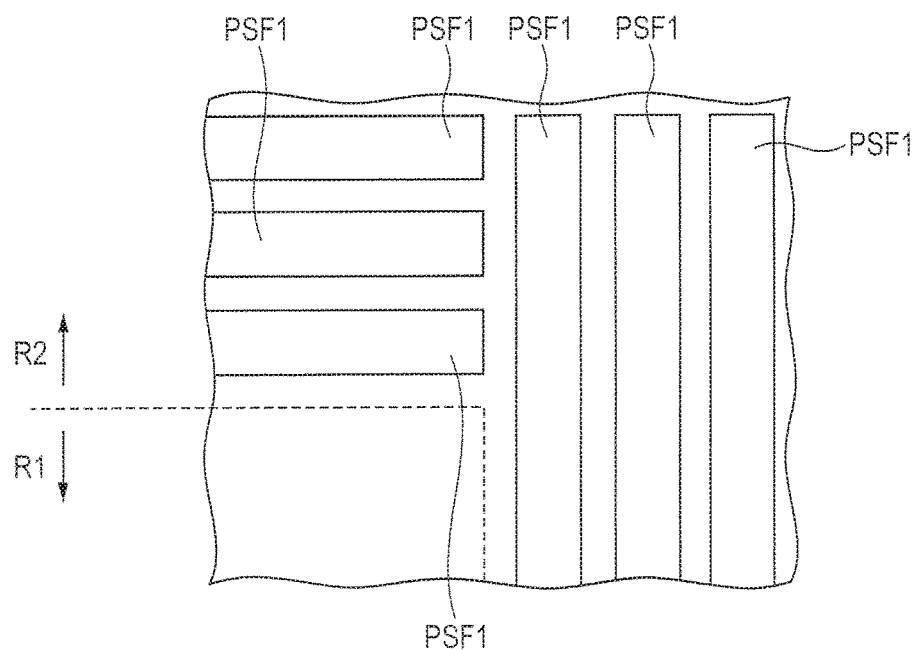
FIG. 31 is a plan view for showing a modified example of the manufacturing method of the semiconductor device according to the first to third embodiments.

As shown in FIG. 31, the planar shape of the one first pattern part PSF1 may be a rectangular shape. The long axis of the planar shape of the one first pattern part PSF1 may be formed along the circumferential direction of the region (for example, the first region R1) where a film to be processed having a uniform height is to be formed. Further, the long axis of the planar shape of the one first pattern part PSF1 may be formed along the direction inclined at an angle of less than 90 degrees with respect to the circumferential direction of the region where a film to be processed having a uniform height is to be formed.

Figure 32:
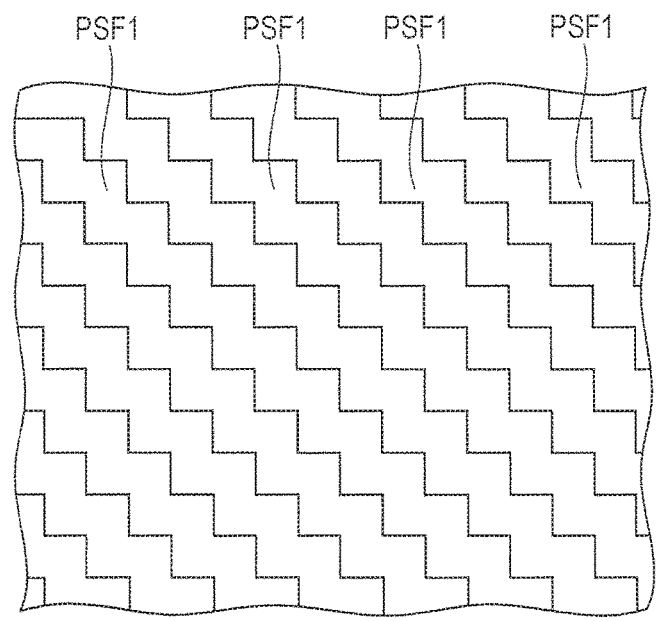
FIG. 32 is a plan view for showing the modified example of the manufacturing method of the semiconductor device according to the first to third embodiments.

As shown in FIG. 32, the planar shape of the one first pattern part PSF1 may be a zigzag shape. The extending direction of the zigzag shape may be formed along the direction inclined at an angle of less than 90 degrees with respect to the circumferential direction of the region (for example, the first region R1) where a film to be processed having a uniform height is to be formed. Further, the extending direction of the zigzag shape may be formed along the circumferential direction of the region where a film to be processed having a uniform height is to be formed.

Figure 33:
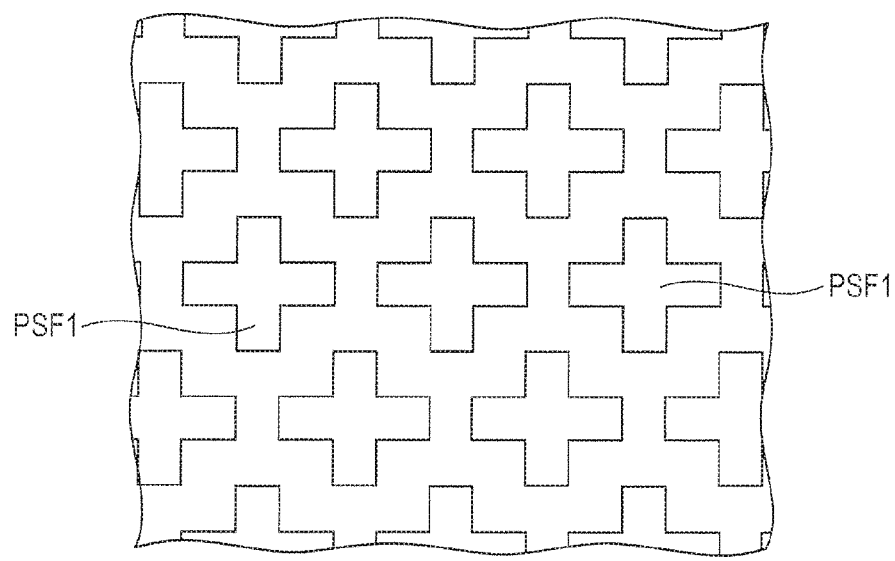
FIG. 33 is a plan view for showing the modified example of the manufacturing method of the semiconductor device according to the first to third embodiments.

As shown in FIG. 33, the planar shape of the one first pattern part PSF1 may be a cross shape. The one first pattern part PSF1 has a shape in which a linear part extending in one direction in planar view intersects a linear part extending in another direction orthogonal to the one direction. As shown in FIG. 33, the one direction of the one first pattern part PSF1 may be formed along the circumferential direction of the region (for example, the first region R1) where a film to be processed having a uniform height is to be formed. Further, the one direction of the one first pattern part PSF1 may be formed along the direction inclined at an angle of less than 90 degrees with respect to the circumferential direction of the region (for example, the first region R1) where a film to be processed having a uniform height is to be formed.

Figure 34:
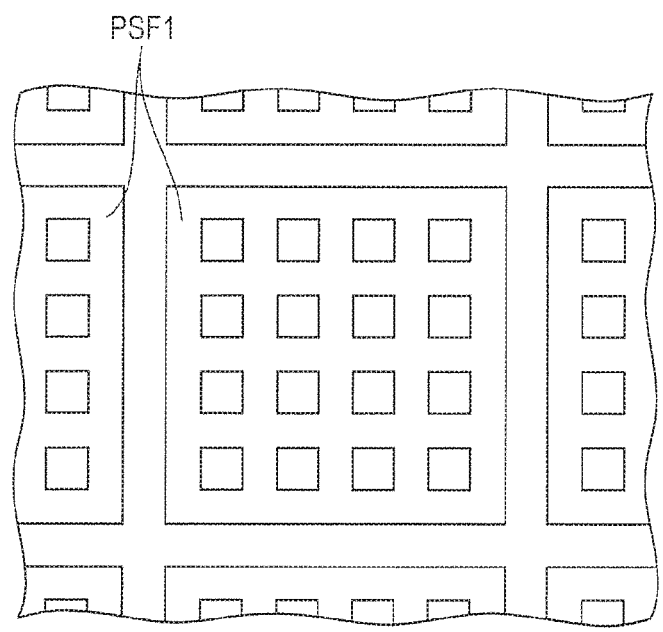
FIG. 34 is a plan view for showing the modified example of the manufacturing method of the semiconductor device according to the first to third embodiments.
Figure 35:
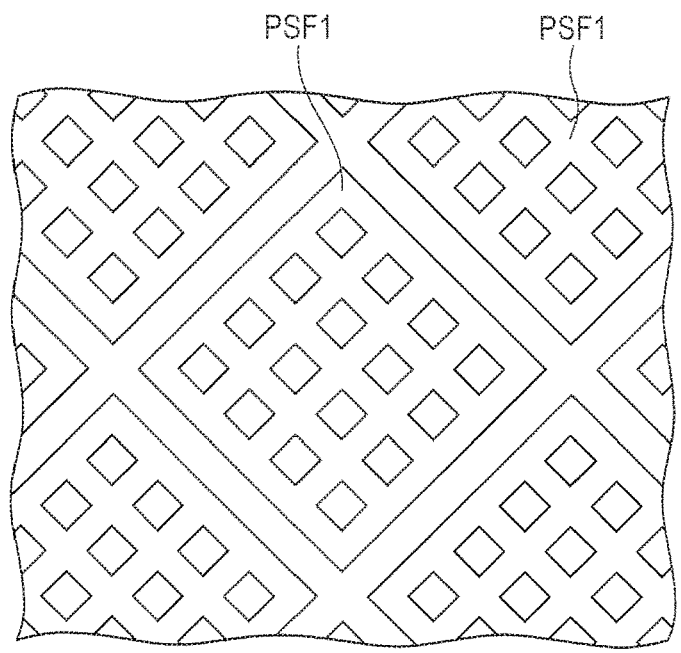
FIG. 35 is a plan view for showing the modified example of the manufacturing method of the semiconductor device according to the first to third embodiments.

As shown in FIG. 34 and FIG. 35, the planar shape of the one first pattern part PSF1 may be a lattice shape. The one first pattern part PSF1 has a shape in which each of a plurality of linear parts extending in one direction in planar view intersects each of a plurality of linear parts extending in another direction orthogonal to the one direction. As shown in FIG. 34, the one direction of the one first pattern part PSF1 may be formed along the circumferential direction of the region (for example, the first region R1) where a film to be processed having a uniform height is to be formed. Further, as shown in FIG. 35, the one direction of the one first pattern part PSF1 may be formed along the direction inclined at an angle of less than 90 degrees with respect to the circumferential direction of the region (for example, the first region R1) where a film to be processed having a uniform height is to be formed.

Figure 36:
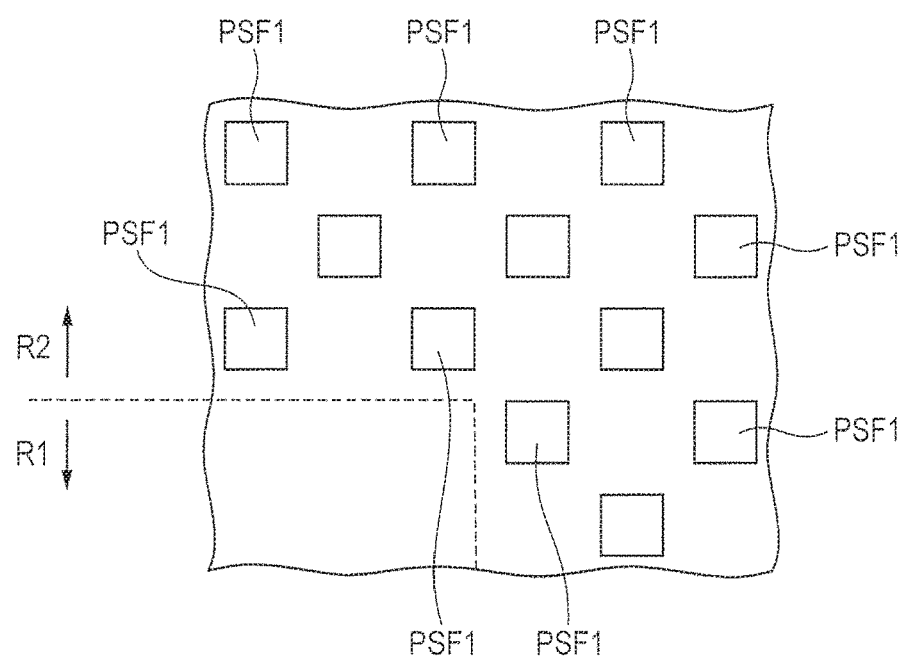
FIG. 36 is a plan view for showing the modified example of the manufacturing method of the semiconductor device according to the first to third embodiments.

As shown in FIG. 36, each of the first pattern parts PSF1 may be formed in a checkerboard pattern in planar view. The planar shape of the one first pattern part PSF1 in this case may be any one shown in FIG. 31 to FIG. 35.

It should be noted that the second pattern part PSF2 may have the same configuration as the first pattern part PSF1 shown in FIG. 31 to FIG. 36.

Figure 37:
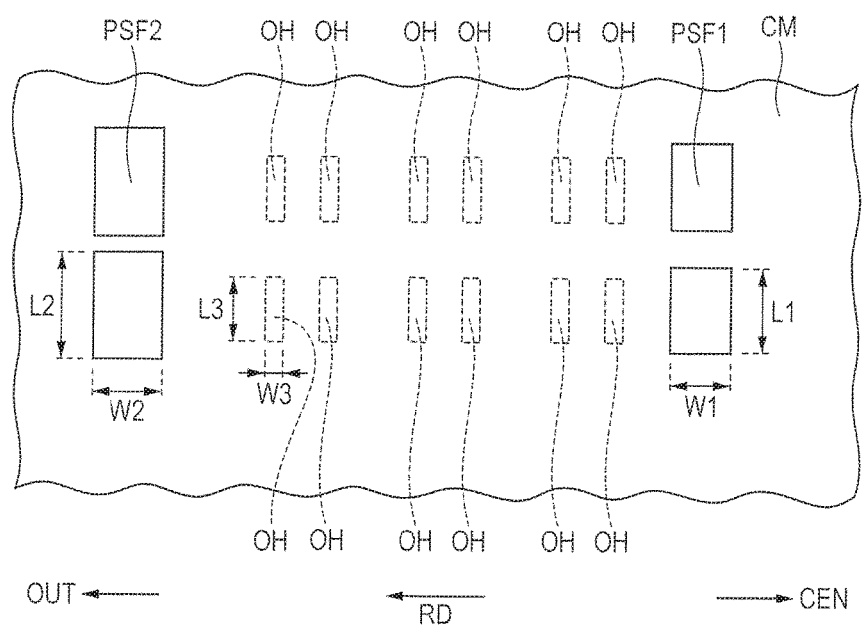
FIG. 37 is a plan view for showing the modified example of the manufacturing method of the semiconductor device according to the first to third embodiments.

As shown in FIG. 37, the first pattern parts PSF1 and the second pattern parts PSF2 may be formed so as to sandwich one step part OH at least in the radial direction RD. Even in such a case, the first pattern parts PSF1 and the second pattern parts PSF2 can suppress a variation in the film thickness of the second coating film LQF in the radial direction RD.

The second coating film LQF may be formed so as to cover at least the step parts OH. The second coating film LQF may be formed so as to cover at least portions of the first pattern parts PSF1 and the second pattern parts PSF2.

The material configuring the first coating film PSF may be, for example, a material showing a glass transition point. In this case, in the process of deforming the first pattern parts PSF1 and the second pattern parts PSF2, the first pattern parts PSF1 and the second pattern parts PSF2 are heated to the glass transition point or higher of the material configuring the first coating film PSF. Accordingly, the first pattern parts PSF1 and the second pattern parts PSF2 can be easily deformed.

The invention made by the inventors has been concretely described above on the basis of the embodiments. However, it is obvious that the present invention is not limited to the above-described embodiments, and can be variously changed without departing from the gist thereof.

The present invention is particularly advantageously applied to a manufacturing method of a semiconductor device having a step of forming a coating film on a semiconductor substrate by a spin coating method.

What is claimed is:

1. A manufacturing method of a semiconductor device comprising the steps of:
   preparing a semiconductor substrate having a main surface and having a first step region where a first step part is formed on the main surface;
   forming a first coating film made of photosensitive material so as to cover the first step region and to become thicker in a central part of the semiconductor substrate in planar view and to become thinner towards an outer peripheral part from the central part;

forming at least one first pattern part located on the central part side relative to the first step region and at least one second pattern part located on the outer peripheral part side relative to the first step region by exposing and developing a portion of the first coating film so that the occupied area of the at least one first pattern part in planar view becomes smaller than that of the at least one second pattern part in planar view;

sagging the at least one first pattern part and the at least one second pattern part by heating;

after the step of sagging the at least one first pattern part and the at least one second pattern part by heating, forming a second coating film by spin coating so as to cover the first step region, and removing at least a portion of the second coating film.

2. The manufacturing method of the semiconductor device according to claim 1, wherein the difference between the thicknesses of the at least one first pattern part and the at least one second pattern part after the step of sagging the at least one first pattern part and the at least one second pattern part by heating is smaller than the difference between the thicknesses of the at least one first pattern part and the at least one second pattern part before the step of sagging the at least one first pattern part and the at least one second pattern part by heating.

3. The manufacturing method of the semiconductor device according to claim 1, wherein at least any one of heat treatment and ultraviolet heat curing treatment is performed for the at least one first pattern part and the at least one second pattern part in the step of sagging the at least one first pattern part and the at least one second pattern part by heating.

4. The manufacturing method of the semiconductor device according to claim 1, wherein the material configuring the second coating film is a non-photosensitive material.

5. The manufacturing method of the semiconductor device according to claim 1, wherein the semiconductor substrate on which a covered film covering the first step region is formed is prepared in the step of preparing the semiconductor substrate, wherein the second coating film is formed on the covered film in the step of forming the second coating film, and wherein at least a portion of the second coating film and at least a portion of the covered film are removed in the step of removing the second coating film.

6. The manufacturing method of the semiconductor device according to claim 1, wherein at least a portion of the second coating film and at least a portion of the first step part are removed in the step of removing the second coating film.

7. The manufacturing method of the semiconductor device according to claim 1, wherein a plurality of first pattern parts and a plurality of second pattern parts are formed in the step of forming the at least one first pattern part and the at least one second pattern part.

8. The manufacturing method of the semiconductor device according to claim 7, wherein the first step region is surrounded by the first pattern parts and the second pattern parts in planar view.

9. The manufacturing method of the semiconductor device according to claim 1, wherein the viscosity of the second coating film is 100 cP or less.

10. The manufacturing method of the semiconductor device according to claim 9, wherein the viscosity of the second coating film is 10 cP or less.

11. The manufacturing method of the semiconductor device according to claim 1, wherein the semiconductor substrate has a second step region in which a plurality of second step parts is formed, wherein a plurality of first step parts is formed in the first step region, and wherein the density of the first step parts arranged in the first step region in planar view is larger than that of the second step parts arranged in the second step region.

12. A manufacturing method of a semiconductor device comprising the steps of:

preparing a semiconductor substrate having a main surface and having a first step region where a first step part is formed on the main surface;

forming a first coating film made of photosensitive material so as to cover the first step region and to become thicker in a central part of the semiconductor substrate in planar view and to become thinner towards an outer peripheral part from the central part;

forming at least one first pattern part located on the central part side relative to the first step region and at least one second pattern part located on the outer peripheral part side relative to the first step region by exposing and developing a portion of the first coating film so that the length of the at least one first pattern part in the radial direction of the semiconductor substrate in a cross section along the radial direction is shorter than that of the at least one second pattern part in the radial direction in the cross section and the thickness of the at least one first pattern part in the cross section is thicker than that of the at least one second pattern part in the cross section;

sagging the at least one first pattern part and the at least one second pattern part by heating;

after the step of sagging the at least one first pattern part and the at least one second pattern part by heating, forming a second coating film by spin coating so as to cover the first step region, and removing at least a portion of the second coating film.

* * * * *